United States Patent
Takagi

(10) Patent No.: US 6,967,528 B2
(45) Date of Patent: Nov. 22, 2005

(54) VARIABLE GAIN AMPLIFIER

(75) Inventor: Susumu Takagi, Kamifukuoka (JP)

(73) Assignee: New Japan Radio Co., Ltd., Saitama-Ken (JP)

( * ) Notice: Subject to any disclaimer, the term of this patent is extended or adjusted under 35 U.S.C. 154(b) by 32 days.

(21) Appl. No.: 10/735,043

(22) Filed: Dec. 12, 2003

(65) Prior Publication Data

US 2004/0124917 A1 Jul. 1, 2004

(30) Foreign Application Priority Data

Dec. 12, 2002 (JP) .............................. 2002-361266
Mar. 5, 2003 (JP) .............................. 2003-058070

(51) Int. Cl.[7] .............................. H03F 1/14; H03F 3/16; H03F 3/191; H03G 3/30
(52) U.S. Cl. ........................ 330/51; 330/277; 330/285; 330/302
(58) Field of Search .......................... 330/51, 151, 277, 330/284, 285, 302

(56) References Cited

U.S. PATENT DOCUMENTS

| | | | |
|---|---|---|---|
| 5,661,434 A | * | 8/1997 | Brozovich et al. ............. 330/51 |
| 6,118,989 A | * | 9/2000 | Abe et al. ................. 455/127.2 |
| 6,127,886 A | * | 10/2000 | Khabbaz et al. .............. 330/51 |
| 6,586,993 B2 | * | 7/2003 | Macedo ........................ 330/51 |

FOREIGN PATENT DOCUMENTS

JP     2001-237650 A     8/2001

OTHER PUBLICATIONS

Patent Abstracts of Japan, English abstract of JP 2001-237650-A, publ. Aug. 31, 2001, based on application JP 2000-045340, filed Feb. 23, 2000.

* cited by examiner

Primary Examiner—Steven J. Mottola

(57) ABSTRACT

The present invention is a variable gain amplifier for amplifying a radio frequency signal by using a field effect transistor for signal amplification. The variable gain amplifier includes: an input impedance correcting means for correcting the input impedance when varying the gain at the input side of the field effect transistor for signal amplification; an output impedance correcting means for correcting the output impedance when varying the gain at the output side of the field effect transistor for signal amplification; and an amplifier bypass means for passing the radio frequency input signal to the output side by skipping the field effect transistor for signal amplification when varying the gain. According to the present invention, a variable gain amplifier is favorable in the voltage standing wave ratio (VSWR) at the input and output end regardless of presence or absence of gain variation, and the gain attenuation amount can be arbitrarily set. Further, according to the present invention, even in the case where the high frequency signal of strong electric field is inputted, favorable input and output power characteristics are obtained.

4 Claims, 6 Drawing Sheets

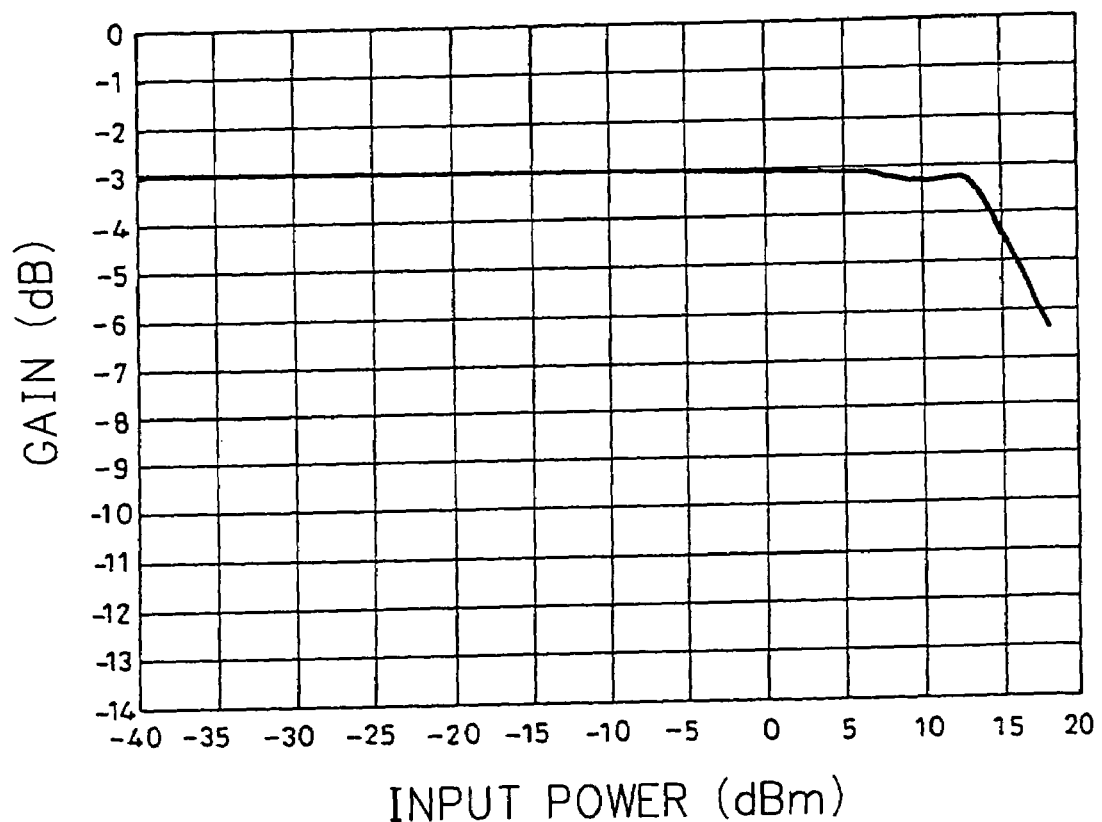

VARIABLE GAIN AMPLIFIER

BACKGROUND OF THE INVENTION

The present invention relates to a variable gain amplifier. More particularly, it relates to a variable gain amplifier enhanced in input and output characteristics, for use in amplification of radio frequency signals in various wireless communication appliances.

In this kind of amplifier known hitherto, for example, at the input side of a semiconductor element for amplifying, a semiconductor element for signal attenuation capable of varying the conductive state by a control voltage from outside is provided in series between a radio frequency input line to the semiconductor element for amplifying and the ground, and the input signal to the semiconductor element for amplifying can be attenuated, so that the gain may be variable (for example, Japanese Unexamined Patent Publication No. 2001-237650, pages 3–4, FIG. 1).

The gain of the amplifier can be varied not only by installing a gain variable circuit as mentioned above, but also, for example, by cutting off the supply voltage of the amplifier, for a sufficient signal input, so as to obtain a minimum gain.

At the input side of the amplifier mentioned above, an input impedance matching circuit for matching the impedance between the circuit of the preceding stage and the amplifier is often disposed, and at the output side, further, an output impedance matching circuit for matching the impedance between the circuit of the later stage and the amplifier is disposed.

Such impedance matching circuit is optimized, usually assuming a case of input of a feeble signal, when the gain is not varied, in other words, when the gain of the amplifier is at maximum, and a favorable characteristic is obtained in the voltage standing wave ratio (VSWR) at the input end and output end of the amplifier. For example, FIG. 6(A) shows an example of measurement of VSWR at the input end when the gain is not varied and when the gain is varied in the amplifier of the configuration shown in the above publication, and FIG. 6(B) shows an example of measurement of VSWR at the output end when the gain is not varied and when the gain is varied in the amplifier of the configuration shown in the above publication, in which it is known that the measurement of VSWR is favorable when the gain is not varied in both cases. In FIG. 6(A), $X_{01}$ shows a point where the measurement of VSWR at the input end when the gain is not varied is 1.78, and $Y_{01}$ shows a point where the measurement of VSWR at the input end when the gain is varied is 9.89. In FIG. 6(B), $X_{02}$ shows a point where the measurement of VSWR at the output end when the gain is not varied is 1.69, and $Y_{02}$ shows a point where the measurement of VSWR at the output end when the gain is varied is 4.23.

On the other hand, when the gain is varied, that is, in the case the gain of the amplifier is minimum, in the amplifier of the configuration shown in the above publication, the semiconductor for signal attenuation is turned ON (in conducting state), and the input and output impedances of the amplifier are significantly difference from those when the gain is not varied, and therefore if the impedance matching circuit is provided each at the input and output end, since these impedance matching circuits are optimized when the gain of the amplifier is maximum, and therefore VSWR when the gain is varied is extremely degraded as shown in FIG. 6(A) and FIG. 6(B).

As a result, it leads to degrading of characteristic of the filter connected in the front stage or rear stage of the amplifier, thereby extremely degrading the reception performance of the wireless communication appliance.

In the case of the amplifier designed to vary the gain by presence or absence of power supply without installing a circuit for varying the gain, although it is an advantage that the power consumption of the wireless communication appliance can be saved by cutting off the power supply, even in this case, since the input and output impedances of the amplifier are significantly different between when the power is supplied and when the power supply is cut off, VSWR at the input and output ends of the amplifier when the power supply is cut off is worse as compared when the power is supplied, and this is the same problem as in the amplifier having the circuit for varying the gain.

Further, in the amplifier for varying the gain by presence or absence of supply of supply voltage, since the gain when varying the gain (when the power supply is not cut off is determined nearly by the isolation between input and output of the semiconductor element for signal amplification, it is impossible to set arbitrarily the gain attenuation amount, that is, the difference in gain when the gain is not varied (the power is supplied) and when the gain is varied (the power is not supplied), which is not convenient for use.

SUMMARY OF THE INVENTION

The invention is devised in the light of the above background, it is hence an object thereof to provide a variable gain amplifier favorable in the VSWR at the input and output end regardless of presence or absence of gain variation while realizing a low power consumption in gain variation.

It is other object of the invention to provide a variable gain amplifier favorable in the VSWR at the input and output end regardless of presence or absence of gain variation, and capable of setting the gain attenuation amount arbitrarily.

It is a different object of the invention to provide a variable gain amplifier favorable in the input and output power characteristic in gain variation.

To achieve the objects, the variable gain amplifier of the invention is a variable gain amplifier designed to amplify the radio frequency signal by using a field effect transistor for signal amplification comprising input impedance correcting means for correcting the input impedance when varying the gain at the input side of the field effect transistor for signal amplification, output impedance correcting means for correcting the output impedance when varying the gain at the output side of the field effect transistor for signal amplification, and amplifier bypass means for passing the radio frequency input signal to the output side by skipping the field effect transistor for signal amplification when varying the gain.

In this configuration, when varying the gain, that is, to obtain the minimum gain, the radio frequency input signal is skipped to the output side by the amplifier bypass means, and fluctuations of the input impedance at the input side of the field effect transistor for signal amplification are corrected by the input impedance correcting means, and fluctuations of the output impedance at the output side of the field effect transistor for signal amplification are corrected by the output impedance correcting means, and therefore as compared with the case not varying the gain, that is, the case of obtaining the maximum gain by operation of the field effect transistor for signal amplification only, fluctuations of VSWR at the input and output terminal of the amplifier when varying the gain are smaller, and the gain attenuation amount can be set arbitrarily. Moreover, the power consumption can be lowered when varying the gain.

Further, the variable gain amplifier of the invention is a variable gain amplifier designed to amplify the radio frequency signal by using a field effect transistor for signal amplification, in which the field effect transistor for signal amplification is of dual gate type, and a first gate terminal is connected to a radio frequency signal input terminal by way of a DC cut capacitor at input side of FET for amplification and an input impedance matching circuit, a drain terminal is connected to a radio frequency signal output terminal by way of an output impedance matching circuit and a DC cut capacitor at output side of FET for amplification, a source terminal of a field effect transistor for bypass of amplifier is connected at the junction of the input side capacitor and the input impedance matching circuit by way of a DC cut capacitor at source side of FET for bypass, a drain terminal of the field effect transistor for bypass of amplifier is connected at the junction of the drain terminal of the field effect transistor for signal amplification and the output impedance matching circuit by way of a DC cut capacitor at drain side of FET for bypass, the drain terminal of field effect transistor for input impedance correction is connected at the junction of the input impedance matching circuit and a DC cut capacitor at input side of FET for amplification by way of a first FET side DC cut capacitor for correction and a first FET side resistor for correction, a source terminal of the field effect transistor for input impedance correction is connected to the ground by way of a first FET side bypass capacitor for correction, a drain terminal of a field effect transistor for output impedance correction is connected at the junction of the drain terminal of the field effect transistor for signal amplification and the output impedance matching circuit by way of a second FET side DC cut capacitor for correction and a second FET side resistor for correction, a source terminal of the field effect transistor for output impedance correction is connected to the ground by way of a second FET side bypass capacitor for correction, each gate terminal of the field effect transistor for bypass of amplifier, the field effect transistor for input impedance correction, and the field effect transistor for output impedance correction is connected to the ground by way of each resistor, and each drain terminal and source terminal of the field effect transistor for bypass of amplifier, the field effect transistor for input impedance correction, and the field effect transistor for output impedance correction are connected to a first control voltage application terminal by way of each resistor, a source terminal of the field effect transistor for signal amplification is connected to a second gate terminal and a drain terminal of field effect transistor for bias SW by way of a inductor, this source terminal is connected to the ground by way of a capacitor, a source terminal of the field effect transistor for bias SW is connected to the ground by way of a self-bias resistor, a gate terminal is connected to a second control voltage application terminal by way of a gate bias resistor.

Moreover, the variable gain amplifier of the invention is a variable gain amplifier designed to amplify the radio frequency signal by using a field effect transistor for signal amplification, in which amplifier bypass means mainly composed of a field effect transistor for bypass of amplifier is connected parallel to the field effect transistor for signal amplification, and a field effect transistor for bias SW for controlling the operation of this transistor is connected to the source terminal side of the field effect transistor for signal amplification, and a second gate terminal of the field effect transistor for signal amplification is connected at the junction of the source terminal of the field effect transistor for bias SW and self-bias resistor.

In such configuration, when varying the gain, that is, to set the amplifier at minimum gain, if the level of the radio frequency input signal is increased to raise the voltage of the source terminal of the field effect transistor for signal amplification, the potential of the second gate terminal of the field effect transistor for signal amplification can be maintained almost at 0 V, and the voltage of this second gate terminal (G2) is always lower than the potential of the source terminal, so that a nonconducting state is always maintained between the drain and source of the field effect transistor for signal amplification, and as a result after the input radio frequency signal of strong electric field passes through the amplifier bypass means, it does not leak to the ground through the drain and source of the field effect transistor for signal amplification, so that a favorable linearity characteristic may be obtained.

Further, the variable gain amplifier of the invention is a variable gain amplifier designed to amplify the radio frequency signal by using a field effect transistor for signal amplification, in which the field effect transistor for signal amplification is of dual gate type, and a first gate terminal is connected to a radio frequency signal input terminal by way of a first DC cut capacitor and an input impedance matching circuit, a drain terminal is connected to a radio frequency signal output terminal by way of an output impedance matching circuit and a second a DC cut capacitor, a source terminal of a field effect transistor for bypass of amplifier is connected at the junction of the first DC cut capacitor and the input impedance matching circuit by way of a third DC cut capacitor, a drain terminal of the field effect transistor for bypass of amplifier is connected at the junction of the drain terminal of the field effect transistor for signal amplification and the output impedance matching circuit by way of a fourth DC cut capacitor, each gate terminal of the field effect transistor for signal amplification and field effect transistor for bypass of amplifier is connected to the ground by way of each resistor, a source terminal of the field effect transistor for signal amplification is connected to the drain terminal of a field effect transistor for bias SW by way of an inductor, its drain terminal is connected to the ground by way of a capacitor, a second gate terminal of the field effect transistor for signal amplification and the source terminal of the field effect transistor for bias SW are mutually connected, a self-bias resistor and a bypass capacitor are connected between the junction and the ground, a gate terminal of the field effect transistor for bias SW is connected to a second control voltage application terminal by way of a gate bias resistor, and the drain terminal and source terminal of the field effect transistor for bypass of amplifier are connected to a first control voltage application terminal by way of each resistor.

BRIEF DESCRIPTION OF THE DRAWINGS

FIGS. 2(A) and 2(B) are characteristic graphs of Smith chart showing a test example of impedance and VSWR at input and output terminal of the variable gain amplifier shown in FIG. 1, in which FIG. 2(A) is a characteristic graph of impedance and VSWR at radio frequency input terminal, and FIG. 2(B) is a characteristic graph of impedance and VSWR at radio frequency output terminal;

FIG. 5 is a characteristic graph of gain changes due to input power by gain variation in the variable gain amplifier shown in FIG. 4; and FIGS. 6(A) and 6(B) are characteristic graphs of Smith chart showing an example of impedance and VSWR at input and output terminal in a conventional circuit, in which FIG. 6(A) is a characteristic graph of impedance and VSWR at radio frequency input terminal, and FIG. 6(B) is a characteristic graph of impedance and VSWR at radio frequency output terminal.

DETAILED DESCRIPTION

Figure 1:
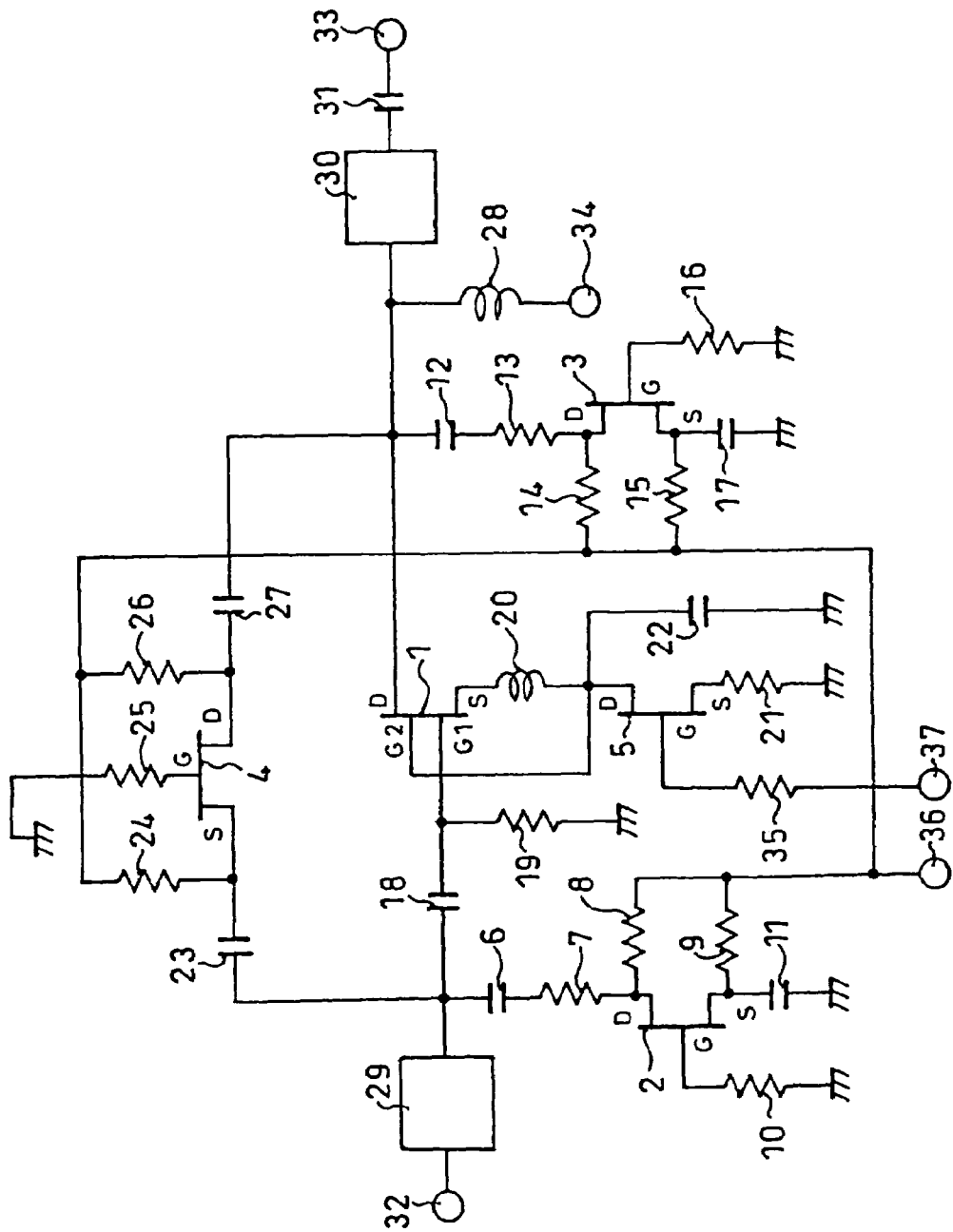
FIG. 1 is a circuit diagram showing an example of circuit configuration of a variable gain amplifier in an embodiment of the invention.
Figure 2A:
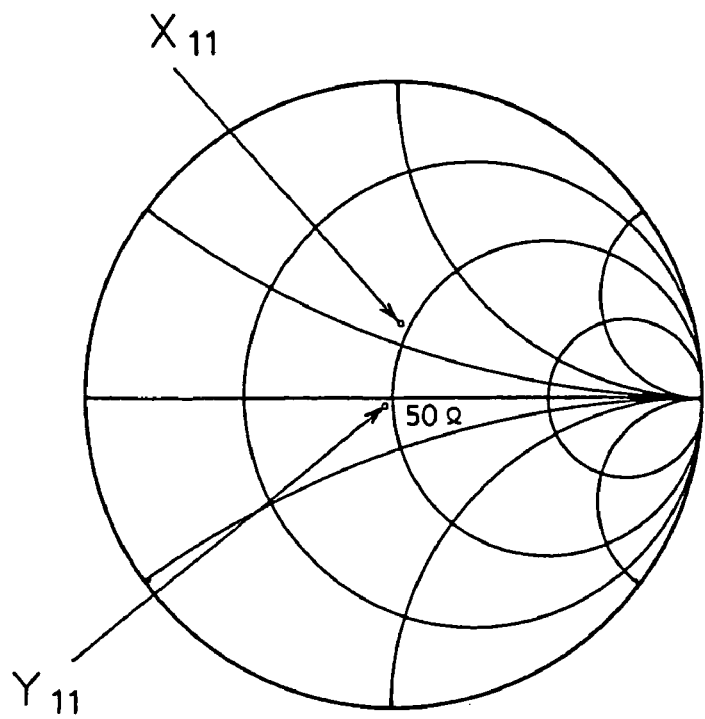
Figure 2B:
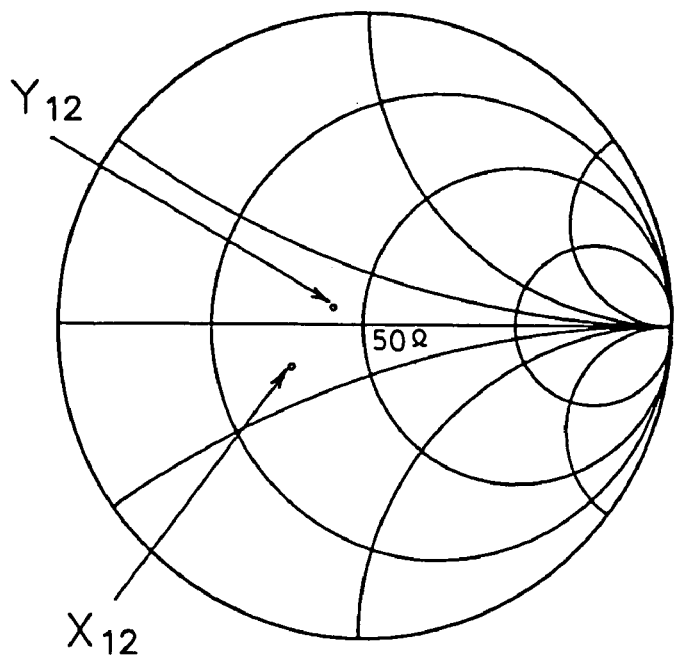

An embodiment of the invention is described while referring to FIG. 1 and FIGS. 2(A) to 2(B).

The members and configuration described below are not intended to limit the invention, but may be changed or modified within the scope and true spirit of the invention.

A variable gain amplifier in the embodiment of the invention is designed to amplify an input radio frequency signal by means of a signal amplifying FET (field effect transistor) 1, and can select presence or absence of gain variation by means of a bias SW FET 5. Further, at the first gate terminal (G1) side of the signal amplifying FET 1, a first DC cut capacitor (first FET side DC cut capacitor for correction) 6, a resistor (first FET side resistor for correction) 7, and an input impedance correction FET 2 are disposed, at the drain terminal side of the signal amplifying FET 1, a second DC cut capacitor (second FET side DC cut capacitor for correction) 12, a resistor (second FET side resistor for correction) 13, and an output impedance correction FET 3 are disposed, and further between the first gate terminal (G1) and drain terminal of the signal amplifying FET 1, a fourth DC cut capacitor (bypass FET source side DC cut capacitor) 23, an amplifier bypass FET 4, and a fifth DC cut capacitor (bypass FET drain side DC cut capacitor) 27 are disposed.

Explaining the circuit connection specifically, first, the signal amplifying FET 1 is preferably MESFET (metal semiconductor field effect transistor), and in the embodiment of the invention it has so-called dual gates of n-channel depression type.

The first gate terminal (G1) of this signal amplifying FET 1 is connected to the ground by way of a resistor 19, and is also connected to a radio frequency signal input terminal 32 by way of a third DC cut capacitor 18 and an input impedance matching circuit 29.

A source terminal of the signal amplifying FET 1 is connected to a drain terminal of the bias SW FET 5, a second gate terminal (G2) of the signal amplifying FET, and one end of a source capacitor 22 by way of a source inductor 20, and other end of the source capacitor 22 is connected to the ground. A source terminal for bias SW FET 5 is connected to the ground by way of a self-bias resistor 21. A gate terminal of the bias SW FET 5 is connected to a second control voltage application terminal 37 by way of a gate bias resistor 35.

A drain terminal of the signal amplifying FET 1 is connected to a supply voltage application terminal 34 by way of a choke inductor 28, and is further connected to a radio frequency signal output terminal 33 by way of an output impedance matching circuit 30 and a sixth DC cut capacitor (amplifying FET output side DC cut capacitor) 31.

On the other hand, the input impedance correcting FET 2 is, for example, of n-channel depression type, and its drain terminal is connected at the junction of the third DC cut capacitor 18 and input impedance matching circuit 29 by way of a resistor 7 (first correcting FET side resistor) and first DC cut capacitor 6 (first correcting FET side DC cut capacitor). A source terminal of the input impedance correcting FET 2 is connected to the ground by way of a first bypass capacitor (first correcting FET side bypass capacitor) 11, and its gate terminal is connected to the ground by way of a resistor 10. Further, a drain terminal and a source of the input impedance correcting FET 2 are commonly connected to a first control voltage application terminal 36 by way of a first bias resistor 8 and a second bias resistor 9, respectively.

In the embodiment of the invention, the input impedance correcting means is realized by the portion mainly composed of this input impedance correcting FET 2.

The output impedance correcting FET 3 is similar to the input impedance correcting FET 2, and is, for example, n-channel depression type, and its drain terminal is connected to the drain terminal of the signal amplifying FET 1 by way of a resistor 13 and a second DC cut capacitor 12, while its source terminal is connected to the ground by way of a second bypass capacitor (second correcting FET side bypass capacitor) 17. A gate terminal of the output impedance correcting FET 3 is connected to the ground by way of a resistor 16. A drain terminal and a source terminal of the output impedance correcting FET 3 are commonly connected to the first control voltage application terminal 36 by way of a third bias resistor 14 and a fourth bias resistor 15, respectively.

In the embodiment of the invention, the output impedance correcting means is realized by the portion mainly composed of this output impedance correcting FET 3.

The amplifier bypass FET 4 is similar to the input impedance correcting FET 2, and is, for example, n-channel depression type, and its source terminal is connected at the junction of the third DC cut capacitor 18 and input impedance matching circuit 29 by way of a fourth DC cut capacitor 23, while its drain terminal is connected to the drain terminal of the signal amplifying FET 1 by way of a fifth DC cut capacitor 27. On the other hand, a gate terminal of the amplifier bypass FET 4 is connected to the ground by way of a resistor 25, while its source terminal and drain terminal are commonly connected to the first control voltage application terminal 36 by way of a fifth bias resistor 24 and a sixth bias resistor 26, respectively.

In the embodiment of the invention, the amplifier bypass means is realized by the portion mainly composed of this amplifier bypass FET 4.

The operation of this structure is explained.

Suppose the control voltage applied to the first control voltage application terminal 36 to be VCONT36, and the pinch-off voltage of input impedance correcting FET 2, output impedance correcting FET 3, and amplifier bypass FET 4 to be identical and Vp.

First, when the gain is not varied (to obtain the maximum gain), a supply voltage so as to actuate the signal amplifying FET 1 is applied to the supply voltage application terminal 34, a bias voltage so as to turn on the bias SW FET 5 (to set in conducting state) is applied to the second control voltage application terminal 36, and a voltage to satisfy the relation of VCONT36≧−Vp is applied to the first control voltage application terminal 36.

As a result, the signal amplifying FET 1 is set in operating state, and the input impedance correcting FET 2, output impedance correcting FET 3, and amplifier bypass FET 4 are all turned OFF (set in nonconducting state).

Each gate width Wgt of the input impedance correcting FET 2, output impedance correcting FET 3, and amplifier bypass FET 4, each capacity value of the DC cut capacitors 6, 12, 23, 27, each resistance value of the resistors 7 and 13, and each capacity value of the bypass capacitors 11 and 17 are optimized so as to suppress the attenuation of the radio frequency input signal and radio frequency output signal in these elements in the state not varying the gain, and therefore the radio frequency signal entered from the radio frequency signal input terminal 32 through the input impedance matching circuit 29 is fed into the gate terminal (G1) of the signal amplifying FET 1 by way of the third DC cut capacitor 18 without being attenuated by the input impedance correcting FET 2 and amplifier bypass FET 4, while the radio frequency signal being amplified and delivered from the drain terminal is issued to the radio frequency signal output terminal 33 by way of the output impedance matching circuit 30 and DC cut capacitor 31 without being attenuated by the output impedance correcting FET 3, so that the maximum gain is obtained by operating same as an ordinary amplifier.

On the other hand, when varying the gain (to obtain the minimum gain), a bias voltage so as to turn OFF the bias SW FET 5 is applied to the second control voltage application terminal 37, and a voltage to satisfy the relation of VCONT36≦−Vp is applied to the first control voltage application terminal 36.

As a result, the signal amplifying FET 1 is turned OFF, and the input impedance correcting FET 2, output impedance correcting FET 3, and amplifier bypass FET 4 are all turned ON (set in conducting state). In this case, since the signal amplifying FET 1 is turned OFF, the radio frequency input signal does not pass through the signal amplifying FET 1, but passes through the bypass route composed of the fourth DC cut capacitor 23, amplifier bypass FET 4, and fifth DC cut capacitor 27.

Hence, since the gain when varying the gain is determined by the passing loss in the bypass route composed of the fourth DC cut capacitor 23, amplifier bypass FET 4, and fifth DC cut capacitor 27, by optimizing the gate width Wgt of the amplifier bypass FET and the capacity value of the fourth and fifth DC cut capacitors 23, 27, the gain in gain variation and the gain attenuation amount can be easily set to desired values.

If the supply voltage so as to actuate the signal amplifying FET 1 remains applied to the supply voltage application terminal 34, since the bias SW FET 5 is turned OFF, the signal amplifying FET 1 does not operate, and the signal amplifying FET 1 is securely kept in OFF state. Accordingly, when varying the gain, the power consumption in the amplifier can be lowered, and the battery operation time of the wireless communication appliance using the amplifier can be extended.

Thus, in the amplifier of the embodiment of the invention, while keeping the signal amplifying FET 1 in off state, by setting the application voltage of the first control voltage application terminal 36 at the value specified above, the input impedance correcting FET 2, amplifier bypass FET 4 and output impedance correcting FET 3 can be turned ON, so that the gate impedance and drain impedance of the signal amplifying FET 1 can be set to the same value as in the on state.

As a result, the VSWR of the radio frequency signal input terminal 32 and radio frequency signal output terminal 33 in the state of addition of the input impedance matching circuit 29 and output impedance matching circuit 30 can be maintained at a favorable value whether the signal amplifying FET 1 is ON or OFF.

Herein, the gate width Wgt of the input impedance correcting FET 2, the resistance value of the resistor 7, and the capacity value of the first DC cut capacitor 6 and first bypass capacitor 11 are set at optimum values so that the VSWR of the radio frequency signal input terminal 32 in gain variation (to obtain the minimum gain) may not be worse as compared with the case of not varying the gain (to obtain the maximum gain). Similarly, the gate width Wgt of the output impedance correcting FET 3, the resistance value of the resistor 13, and the capacity value of the second DC cut capacitor 12 and bypass capacitor 17 are set at optimum values so that the VSWR of the radio frequency signal output terminal 33 in gain variation may not be worse as compared with the case of not varying the gain.

FIG. 2(A) and FIG. 2(B) show test examples of VSWR in the radio frequency signal input terminal 32 and radio frequency signal output terminal 33 of the amplifier in the embodiment of the invention.

FIG. 2(A) shows the test example of VSWR in the radio frequency signal input terminal 32 and FIG. 2(B) shows the test example of VSWR in the radio frequency signal output terminal 33, both showing test examples of VSWR when varying the gain and when not varying the gain. In FIG. 2(A), $X_{11}$ shows a point where the measurement of VSWR at the radio frequency signal input terminal 32 when the gain is not varied is 1.60, and $Y_{11}$ shows a point where the measurement of VSWR at the radio frequency signal input terminal 32 when the gain is varied is 1.08. In FIG. 2(B), $X_{12}$ shows a point where the measurement of VSWR at the radio frequency signal output terminal 33 when the gain is not varied is 1.78, and $Y_{12}$ shows a point where the measurement of VSWR at the radio frequency signal output terminal 33 when the gain is varied is 1.27.

In any case, although there is a slight difference in the VSWR between when the gain is varied and when the gain is not varied, it is significantly improved as compared with the prior art (see FIG. 6).

In this structural example, the amplifier bypass FET 4, input impedance correcting FET 2 and output impedance correcting FET 3 are provided by one piece each, but as required a plurality of them may be connected in series.

In this embodiment, while realizing a low power consumption in gain variation, a variable gain amplifier of favorable VSWR at input and output end regardless of presence or absence of gain variation can be obtained. In the circuit configuration of such variable gain amplifier, when not varying the gain (to obtain the maximum gain), a voltage so as to actuate the signal amplifying FET 1 is applied to the supply voltage application terminal 34, a bias voltage so as to turn ON the bias SW FET 5 is applied to the second control voltage application terminal 37, and a bias voltage of −Vp or more is applied to the first control voltage application terminal 36, supposing the pinch-off voltage of the amplifier bypass FET 4, input impedance correcting FET 2, and output impedance correcting FET 3 to be Vp, and therefore the signal amplifying FET 1 is set in a state of amplifying operation, while the amplifier bypass FET 4, input impedance correcting FET 2, and output impedance correcting FET 3 are turned OFF. Accordingly, the radio frequency signal applied to the radio frequency signal input terminal 32 is not attenuated by the amplifier bypass FET 4, input impedance correcting FET 2, and output impedance correcting FET 3, and is amplified by the signal amplifying FET 1 at maximum gain, and is obtained from the radio frequency signal output terminal 33.

On the other hand, when varying the gain, that is, to obtain the minimum gain, a bias voltage so as to turn OFF the bias SW FET 5 is applied to the second control voltage application terminal 37, a bias voltage of −Vp or less is applied to the first control voltage application terminal 36, and therefore the signal amplifying FET 1 is turned OFF, while the amplifier bypass FET 4, input impedance correcting FET 2, and output impedance correcting FET 3 are turned ON. Accordingly, the radio frequency signal applied to the radio frequency signal input terminal 32 is skipped to the radio frequency signal output terminal 33 by way of the amplifier bypass FET 4, and input impedance fluctuations at the input side of the signal amplifying FET 1 are corrected by the circuit portion mainly composed of the input impedance correcting FET 2, while output impedance fluctuations at the output side of the signal amplifying FET 1 are corrected by the circuit portion mainly composed of the output impedance correcting FET 3. Therefore, as compared with the state not varying the gain, that is, the state of obtaining the maximum gain by operation of the signal amplifying FET 1 only, fluctuations of the VSWR at the input and output terminal in gain variation are smaller, and the power consumption can be lowered when varying the gain.

In this variable gain amplifier, however, the following problems are involved.

First, if the signal amplifying FET 1 is turned OFF and the radio frequency signal applied to the radio frequency signal input terminal 32 is skipped to the radio frequency signal output terminal 33 by way of the amplifier bypass FET 4, since the signal amplifying FET 1 is disposed parallel to the bypass circuit mainly composed of the amplifier bypass FET 4, the radio frequency signal applied to the radio frequency signal input terminal 32 is actually applied to the first gate terminal (G1) of the signal amplifying FET 1, and its signal level increases along with the increase of the level of the radio frequency signal applied to the radio frequency signal input terminal 32.

Herein, between the first gate terminal (G1) of the signal amplifying FET 1 and the source, it may be regarded that a diode is connected equivalently. Therefore, as mentioned above, when the potential of the first gate terminal (G1) is raised by the radio frequency signal input, the source potential is also elevated similarly. Besides, since the second gate terminal (G2) of the signal amplifying FET 1 is connected to the source of the signal amplifying FET 1 by way of the source inductor 20, the potential of the second gate terminal (G2) consequently elevated together with the source potential.

Incidentally, in the drain of the signal amplifying FET 1, a bias for operating this signal amplifying FET 1 is preliminarily applied from the supply voltage application terminal 34 by way of the choke inductor 28, and when a radio frequency signal input signal of strong electric field is applied, for example, to the radio frequency signal input terminal 32, the potentials of the source terminal and second gate terminal (G2) of the signal amplifying FET 1 are raised as mentioned above, and hence the potentials of the drain terminal, source terminal and second gate terminal (G2) of the signal amplifying FET 1 are nearly at a same potential (0 V), which may bring about an inconvenience of making a conducting state between the drain and the source of the signal amplifying FET 1 which are supposed to be in nonconducting state. Accordingly, the radio frequency signal of strong electric field applied to the radio frequency signal input terminal 32 is delivered to the radio frequency signal output terminal 33 by way of the input impedance matching circuit 29, DC cut capacitor 23, amplifier bypass FET 4, and DC cut capacitor 27, and may further leak to the ground through the drain and source of the signal amplifying FET 1 substantially set in conducting state, and the source inductor 20 and source capacitor 22. In this way, the radio frequency signal to be issued to the radio frequency signal output signal 33 is attenuated, and in the variable gain amplifier shown in FIG. 1, the linearity characteristic in the case of input of radio frequency signal of strong electric field is extremely spoiled.

Figure 3:
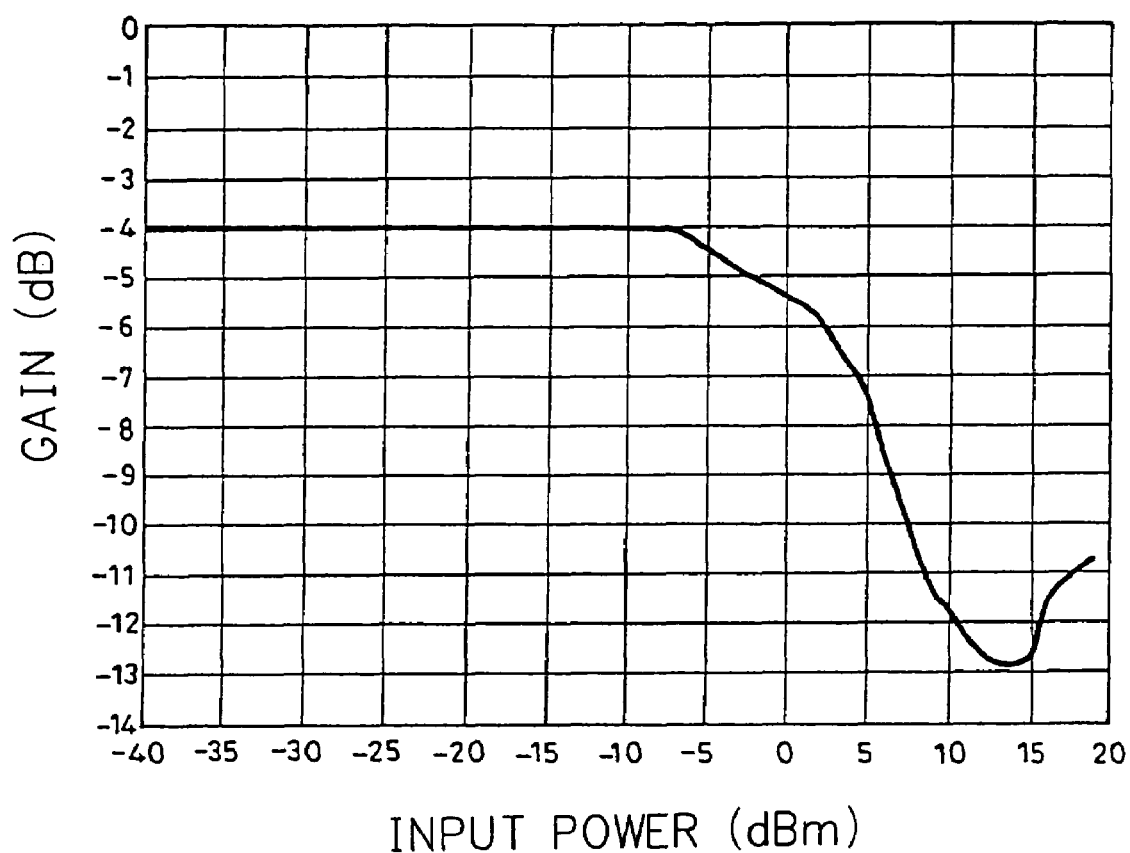
FIG. 3 is a characteristic graph of gain changes due to input power by gain variation in the variable gain amplifier shown in FIG. 1.

FIG. 3 is a characteristic diagram showing the mode of gain change due to input power by gain variation in the variable gain amplifier shown in FIG. 1, in which when the input level of the radio frequency signal is increased, the linearity characteristic as the amplifier is extremely impaired.

Other embodiment of the invention is described below while referring to FIG. 4 and FIG. 5.

The members and configuration described below are not intended to limit the invention, but may be changed or modified within the scope and true spirit of the invention.

A variable gain amplifier in the other embodiment of the invention is designed to amplify an input radio frequency signal by means of a signal amplifying FET (field effect transistor) 101, and can select presence or absence of gain variation by means of a bias SW FET 102. Further, between the first gate terminal (G1) and drain terminal of the signal amplifying FET 101, bypass circuit 201 is provided as amplifier bypass means which is composed of a third DC cut capacitor (bypass FET source side DC cut capacitor) 113, an amplifier bypass FET 103, and fourth DC cut capacitor (bypass FET drain side DC cut capacitor) 114.

Explaining the circuit connection specifically, first, the signal amplifying FET 101 is preferably MESFET (metal semiconductor field effect transistor), and in the embodiment of the invention it has so-called dual gates of n-channel depression type.

The first gate terminal (G1) of this signal amplifying FET 101 is connected to the ground by way of a resistor 121, and is also connected to a radio frequency signal input terminal 141 by way of a first DC cut capacitor 111 and an input impedance matching circuit 134.

A source terminal of the signal amplifying FET 101 is connected to a drain terminal of the bias SW FET 102, and one end of a source capacitor 115 by way of a source inductor 131, and other end of the source capacitor 115 is connected to the ground. A source terminal for bias SW FET 102 is mutually connected with a second gate terminal (G2) of the signal amplifying FET 101, and between this mutual connection junction and the ground, a second resistor (self-bias resistor) 122 and a bypass capacitor 116 are connected in parallel.

A drain terminal of the signal amplifying FET 101 is connected to a supply voltage application terminal 143 by way of a choke inductor 132, and is further connected to a radio frequency signal output terminal 142 by way of an output impedance matching circuit 135 and a second DC cut capacitor 116.

On the other hand, the amplifier bypass FET 103 is, for example, of n-channel depression type, and its source terminal is connected at the junction of the first DC cut capacitor 111 and input impedance matching circuit 134 by way of a third DC cut capacitor 113, while its drain terminal is connected to the drain terminal of the signal amplifying FET 101 by way of a fourth DC cut capacitor 114. On the other hand, a gate terminal of the amplifier bypass FET 103 is connected to the ground by way of a fifth resistor 125, while its source terminal and drain terminal are commonly connected to the first control voltage application terminal 145 by way of a fourth resistor 124 and a sixth resistor 126, respectively.

The operation of this structure is explained.

Suppose the control voltage applied to the first control voltage application terminal 145 to be VCONT145, and the pinch-off voltage of the amplifier bypass FET 103 to be Vp.

First, when the gain is not varied (to obtain the maximum gain), a supply voltage so as to actuate the signal amplifying FET 101 is applied to the supply voltage application terminal 143, a bias voltage so as to turn on the bias SW FET 105 (to set in conducting state) is applied to the second control voltage application terminal 144, and a voltage to satisfy the relation of VCONT145≧−Vp is applied to the first control voltage application terminal 145.

As a result, the signal amplifying FET 101 is set in operating state, and the amplifier bypass FET 103 all turned OFF (set in nonconducting state).

In this state without gain variance, the gate width Wgt of the amplifier bypass FET 103, and each capacity value of the third and fourth DC cut capacitors 113, 114 are optimized so as to suppress the attenuation of the radio frequency input signal and radio frequency output signal in these elements, and therefore the radio frequency signal entered from the radio frequency signal input terminal 141 through the input impedance matching circuit 134 is fed into the gate terminal (G1) of the signal amplifying FET 101 by way of the first DC cut capacitor 111 without being attenuated by the amplifier bypass FET 103, and the radio frequency signal being amplified and delivered from the drain terminal is issued to the radio frequency signal output terminal 142 by way of the output impedance matching circuit 135 and second DC cut capacitor 112 without being attenuated by the amplifier bypass FET 103, so that the maximum gain is obtained by operating same as an ordinary amplifier.

On the other hand, when varying the gain (to obtain the minimum gain), a bias voltage so as to turn OFF the bias SW FET 102 is applied to the second control voltage application terminal 144, and a voltage to satisfy the relation of VCONT145≦−Vp is applied to the first control voltage application terminal 145.

As a result, the signal amplifying FET 101 is turned OFF, and the amplifier bypass FET 103 is turned ON (set in conducting state). In this case, since the signal amplifying FET 101 is turned OFF, the radio frequency input signal does not pass through the signal amplifying FET 101, but passes through the bypass route composed of the third DC cut capacitor 113, amplifier bypass FET 103, and fourth DC cut capacitor 114.

Hence, since the gain when varying the gain is determined by the passing loss in the bypass circuit 201 composed of the third DC cut capacitor 113, amplifier bypass FET 103, and fourth DC cut capacitor 114, by optimizing the gate width Wgt of the amplifier bypass FET 103 and the capacity values of the third and fourth DC cut capacitors 113, 114, the gain in gain variation and the gain attenuation amount can be easily set to desired values.

For example, in the circuit shown in FIG. 1, as mentioned above, when the level of the radio frequency input signal increases when varying the gain, the potentials of the source terminal and second gate terminal (G2) of the signal amplifying FET 1 elevate, and the potentials of the drain terminal, source terminal and second gate terminal (G2) of the signal amplifying FET 1 are nearly the same potential (0 V), and the drain and source of the signal amplifying FET 1 which are supposed to be in nonconducting state are set in conducting sate, and the radio frequency signal passing through the bypass circuit mainly composed of the amplifier bypass FET 4 leaks to the ground through the drain and source of the signal amplifying FET 1. By the leak of the radio frequency signal, the radio frequency signal to be issued to the radio frequency output terminal 33 is attenuated, and hence if a radio frequency signal of high electric field is entered during gain variation, the linearity characteristic of the amplifier is lost.

By contrast, in the variable gain amplifier of the other embodiment of the invention, as mentioned above, since the second gate terminal (G2) of the signal amplifying FET 101 is connected at the junction of the source terminal and second resistor (self-bias resistor) 122 of the bias SW FET 102, if the level of the radio frequency input signal increases when varying the gain and the voltage of the source terminal of the signal amplifying FET 101 elevates, the potential of the second gate terminal (G2) of the signal amplifying FET 101 remains almost at 0 V, and the voltage of the second gate terminal (G2) is always kept lower than the potential of the source terminal. That is, in the gain variation time, since the second gate terminal (G2) of the signal amplifying FET 101 can be always set in pinch-off state, even in the case of input of radio frequency signal of strong electric field from the radio frequency signal input terminal 141, the drain and source of the signal amplifying FET 101 can be always kept in nonconducting state. As a result, the radio frequency signal of strong electric field entering from the radio frequency signal input terminal 141 passes through the bypass circuit 201, and is issued to the radio frequency signal output terminal 142, without leaking to the ground through the drain and source of the signal amplifying FET 101, that is, without being attenuated by the signal amplifying FET 101, and therefore the variable gain amplifier of this embodiment of the invention is capable of obtaining a favorable linearity characteristic even in the case of input of radio frequency signal of strong electric field.

FIG. 5 is a characteristic diagram showing gain changes due to input power by gain variation of the variable gain amplifier in the other embodiment of the invention, and when compared with the characteristic diagram (FIG. 3) of a similar circuit shown in FIG. 1, in the case of the circuit in FIG. 1, the input power when the gain is compressed by 1 dB (that is, the input power at 1 dB gain compression) is about −2.9 dBm, whereas the variable gain amplifier in the other embodiment of the invention shows the input power at 1 dB gain compression of about +14.1 dBm, and as compared with the circuit in FIG. 1, the input power at 1 dB gain compression is improved by about 17 dB.

In the shown structural example, the amplifier bypass FET 103 is composed of one stage, but it may be composed by connecting a plurality of stages in series as required.

As described herein, according to the invention, when varying, that is, to obtain the minimum gain only, by configuring to operate the field effect transistor for input impedance correction composing the input impedance correcting means, the field effect transistor for output impedance correction composing the output impedance correcting means, and the field effect transistor for amplifier bypass composing the amplifier bypass means, the field effect transistor for signal amplification is kept in non-operating state, and as compared with the state not varying the gain, that is, the state of obtaining the maximum gain by operation of the field effect transistor for signal amplification, fluctuations of VSWR at the radio frequency input terminal and radio frequency output terminal in gain variation time can be decreased, and therefore the characteristics of the filter and others connected in the front stage or rear stage of the variable gain amplifier are not spoiled even when varying the gain.

Also according to the invention, since the gain and gain attenuation quantities in gain variation can be set freely, and an amplifier of desired gain and gain attenuation quantities can be easily obtained. At the same time, the power consumption can be lowered when varying the gain.

Moreover, according to the invention, when varying the gain, that is, to obtain the minimum gain, in the event of input of radio frequency signal of strong electric field, the transistor for amplifying the signal which is supposed to be in non-operating state is prevented from coming to operating state by radio frequency signal of strong electric field, and therefore favorable input and output power characteristics are obtained, and when applied in a wireless communication appliance, the gain can be varied according to the input signal level without degrading the reception performance.

Though several embodiments of the present invention are described above, it is to be understood that the present invention is not limited only to the above-mentioned, various changes and modifications may be made in the invention without departing from the spirit and scope thereof.

What is claimed is:

1. Variable gain amplifier for amplifying a radio frequency signal by using a field effect transistor (FET) for signal amplification, in which the field effect transistor for signal amplification is of dual gate type, and
   a first gate terminal is connected to a radio frequency signal input terminal via a DC cut capacitor at an input side of said FET for amplification and via an input impedance matching circuit,
   a drain terminal is connected to a radio frequency signal output terminal via an output impedance matching circuit and a DC cut capacitor at an output side of said FET for amplification;
   wherein a source terminal, of a field effect transistor (FET) for bypassing an amplifier element, is connected at a junction of the input side capacitor and the input impedance matching circuit via a DC cut capacitor at a source side of said FET for amplifier bypassing, a drain terminal of the field effect transistor for amplifier bypassing is connected at a junction of the drain terminal of the field effect transistor for signal amplification and the output impedance matching circuit via a DC cut capacitor at drain side of said FET for bypassing;
   wherein the drain terminal of said field effect transistor for input impedance correction is connected at a junction of the input impedance matching circuit and a DC cut capacitor at an input side of said FET for amplification, via a first FET side DC cut capacitor for correction and a first FET side resistor for correction,
   wherein a source terminal of the field effect transistor for input impedance correction is connected to ground via a first FET side bypass capacitor for correction;
   wherein a drain terminal of a field effect transistor for output impedance correction is connected at a junction of the drain terminal of the field effect transistor for signal amplification and the output impedance matching circuit via a second FET side DC cut capacitor for correction and a second FET side resistor for correction,
   wherein a source terminal of the field effect transistor for output impedance correction is connected to ground via a second FET side bypass capacitor for correction;
   wherein each gate terminal of the field effect transistor for amplifier bypassing, the field effect transistor for input impedance correction, and the field effect transistor for output impedance correction is connected to ground via a respective resistor;
   wherein each drain terminal and source terminal of the field effect transistor for amplifier bypassing, the field effect transistor for input impedance correction, and the field effect transistor for output impedance correction are connected to a first control voltage application terminal via a respective resistor;
   wherein a source terminal of the field effect transistor for signal amplification is connected to a second gate terminal and a drain terminal of a field effect transistor for bias SW via an inductor, this source terminal is connected to ground via a capacitor; and
   wherein a source terminal of the field effect transistor for bias SW is connected to ground via a self-bias resistor, and a gate terminal thereof is connected to a second control voltage application terminal via a gate bias resistor.

2. Variable gain amplifier of claim 1, wherein a selected one of said field effect transistor for amplifier bypassing, said field effect transistor for input impedance correction, and the field effect transistor for output impedance correction comprises a plurality of transistors connected in series.

3. Variable gain amplifier for amplifying a radio frequency signal by using a field effect transistor for signal amplification, wherein an amplifier bypass means comprising a field effect transistor for amplifier element bypassing is connected parallel to the field effect transistor for signal amplification,
   wherein a field effect transistor for bias SW for controlling the operation of the transistor for signal amplification is connected to the source terminal side of the field effect transistor for signal amplification, and
   wherein a second gate terminal of the field effect transistor for signal amplification is connected at a junction of the source terminal of the field effect transistor for bias SW and a self-bias resistor.

4. Variable gain amplifier for amplifying a radio frequency signal by using a field effect transistor for signal amplification,
   wherein the field effect transistor for signal amplification is of dual gate type, a first gate terminal is connected to a radio frequency signal input terminal via a first DC cut capacitor and an input impedance matching circuit, and a drain terminal is connected to a radio frequency signal output terminal via an output impedance matching circuit and a second a DC cut capacitor;
   wherein a source terminal of a field effect transistor for amplifier element bypassing, is connected at a junction of the first DC cut capacitor and the input impedance matching circuit via a third DC cut capacitor, and a drain terminal, of the field effect transistor for amplifier element bypassing, is connected at a junction of the drain terminal of the field effect transistor for signal amplification and the output impedance matching circuit via a fourth DC cut capacitor;

wherein each gate terminal of the field effect transistor for signal amplification and field effect transistor for amplifier element bypassing is connected to ground via a respective resistor, a source terminal of the field effect transistor for signal amplification is connected to a drain terminal of a field effect transistor for bias SW via an inductor, and said drain terminal is connected to ground via a capacitor;

wherein a second gate terminal of the field effect transistor for signal amplification and the source terminal of the field effect transistor for bias SW are mutually connected, and a self-bias resistor and a bypass capacitor are connected between the junction and ground;

wherein a gate terminal of the field effect transistor for bias SW is connected to a second control voltage application terminal via a gate bias resistor; and wherein the drain terminal and the source terminal of the field effect transistor for amplifier element bypassing are connected to a first control voltage application terminal via a respective resistor.

* * * * *

UNITED STATES PATENT AND TRADEMARK OFFICE
CERTIFICATE OF CORRECTION

| | | |
|---|---|---|
| PATENT NO. | : 6,967,528 B2 | |
| APPLICATION NO. | : 10/735043 | |
| DATED | : November 22, 2005 | |
| INVENTOR(S) | : Takagi et al. | |

It is certified that error appears in the above-identified patent and that said Letters Patent is hereby corrected as shown below:

PLEASE DELETE THE TITLE PAGE AND REPLACE WITH THE ATTACHED TITLE PAGE.

PLEASE DELETE THE SPECIFICATION AND CLAIMS; COLUMNS 1 THROUGH 16 IN IT'S ENTIRITY AND INSERT THE ATTACHED SPECIFICATION AND CLAIMS COLUMN 1 THROUGH 16 AS FOLLOWS.

Signed and Sealed this

Fifth Day of June, 2007

JON W. DUDAS
*Director of the United States Patent and Trademark Office*

(12) United States Patent
Takagi

(10) Patent No.: US 6,967,528 B2
(45) Date of Patent: Nov. 22, 2005

(54) VARIABLE GAIN AMPLIFIER

(75) Inventor: Susumu Takagi, Kamifukuoka (JP)

(73) Assignee: New Japan Radio Co., Ltd., Saitama-Ken (JP)

(*) Notice: Subject to any disclaimer, the term of this patent is extended or adjusted under 35 U.S.C. 154(b) by 32 days.

(21) Appl. No.: 10/735,043

(22) Filed: Dec. 12, 2003

(65) Prior Publication Data
US 2004/0124917 A1 Jul. 1, 2004

(30) Foreign Application Priority Data
Dec. 12, 2002 (JP) .............................. 2002-361266
Mar. 5, 2003 (JP) .............................. 2003-058070

(51) Int. Cl.[7] .................... H03F 1/14; H03F 3/16; H03F 3/191; H03G 3/30
(52) U.S. Cl. .................. 330/51; 330/277; 330/285; 330/302
(58) Field of Search ................ 330/51, 151, 277, 330/284, 285, 302

(56) References Cited

U.S. PATENT DOCUMENTS

| | | | |
|---|---|---|---|
| 5,661,434 A | * | 8/1997 | Brozovich et al. ............ 330/51 |
| 6,118,989 A | * | 9/2000 | Abe et al. .................. 455/127.2 |
| 6,127,886 A | * | 10/2000 | Khabbaz et al. ............. 330/51 |
| 6,586,993 B1 | * | 7/2003 | Macedo ...................... 330/51 |

FOREIGN PATENT DOCUMENTS

JP 2001-237650 A 8/2001

OTHER PUBLICATIONS

Patent Abstracts of Japan, English abstract of JP 2001-237650-A, publ. Aug. 31, 2001, based on application JP 2000-045340, filed Feb. 23, 2000.

* cited by examiner

*Primary Examiner*—Steven J. Mottola

(57) ABSTRACT

The present invention is a variable gain amplifier for amplifying a radio frequency signal by using a field effect transistor for signal amplification. The variable gain amplifier includes: an input impedance correcting means for correcting the input impedance when varying the gain at an input side of the field effect transistor for signal amplification; an output impedance correcting means for correcting the output impedance when varying the gain at an output side of the field effect transistor for signal amplification; and an amplifier bypass means for passing the radio frequency input signal directly to the output side, skipping the field effect transistor for signal amplification, when varying the gain. According to a preferred embodiment, a variable gain amplifier provides a favorable voltage standing wave ratio (VSWR) at the input and output ends, regardless of the presence or absence of gain variation, and the gain attenuation amount can be arbitrarily set. Further, according to the present invention, even in the case where the high frequency signal having a strong electric field is inputted, favorable input and output power characteristics are obtained.

4 Claims, 6 Drawing Sheets

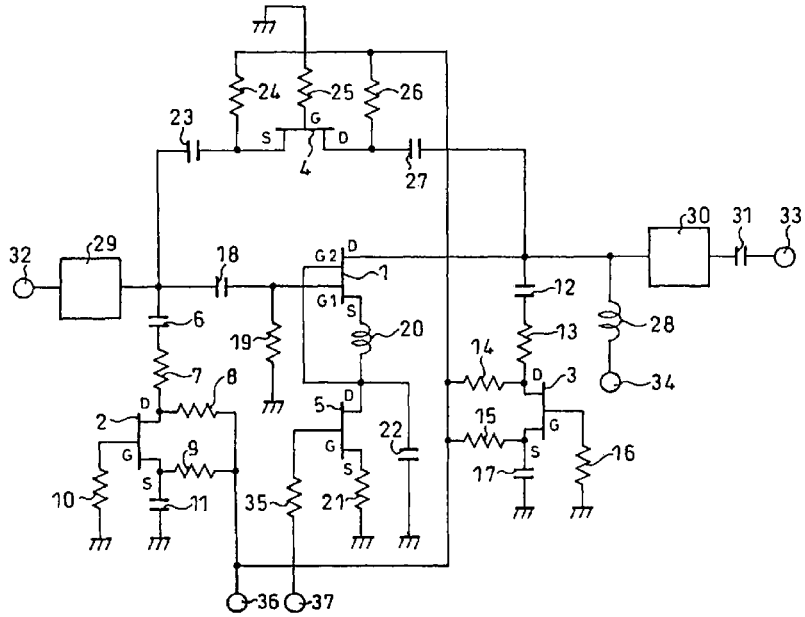

VARIABLE GAIN AMPLIFIER

FIELD OF THE INVENTION

The present invention relates to a variable gain amplifier. More particularly, it relates to a variable gain amplifier enhanced in input and output characteristics, for use in amplification of radio frequency signals in various wireless communication appliances.

BACKROUND

In this kind of amplifier known hitherto, for example, at the input side of a semiconductor element for amplifying, a semiconductor element for signal attenuation capable of varying the conductive state by a control voltage from outside is provided in series between a radio frequency input line to the semiconductor element for amplifying and the ground, and the input signal to the semiconductor element for amplifying can be attenuated, so that the gain may be variable (for example, Japanese Unexamined Patent Publication No. 2001-237650, pages 3–4, FIG. 1, resulting from application 2000-045340 of Koji Hayashi, filed 23 Feb. 2000).

The gain of the amplifier can be varied not only by installing a gain variable circuit as mentioned above, but also, for example, by cutting off the supply voltage of the amplifier, for a sufficient signal input, so as to obtain a minimum gain.

At the input side of the amplifier mentioned above, an input impedance matching circuit for matching the impedance between the circuit of the preceding stage and the amplifier is often disposed, and at the output side, further, an output impedance matching circuit for matching the impedance between the circuit of the later stage and the amplifier is disposed.

Figure 6A:
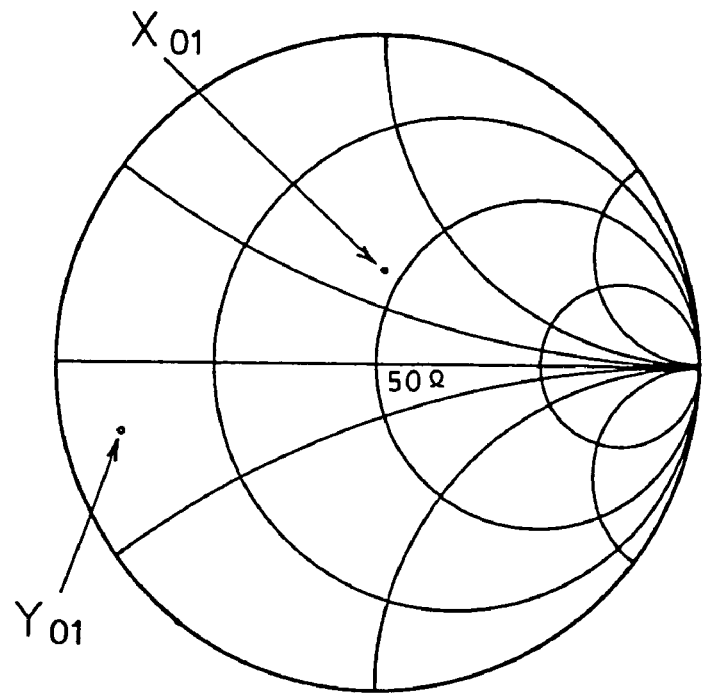
Figure 6B:
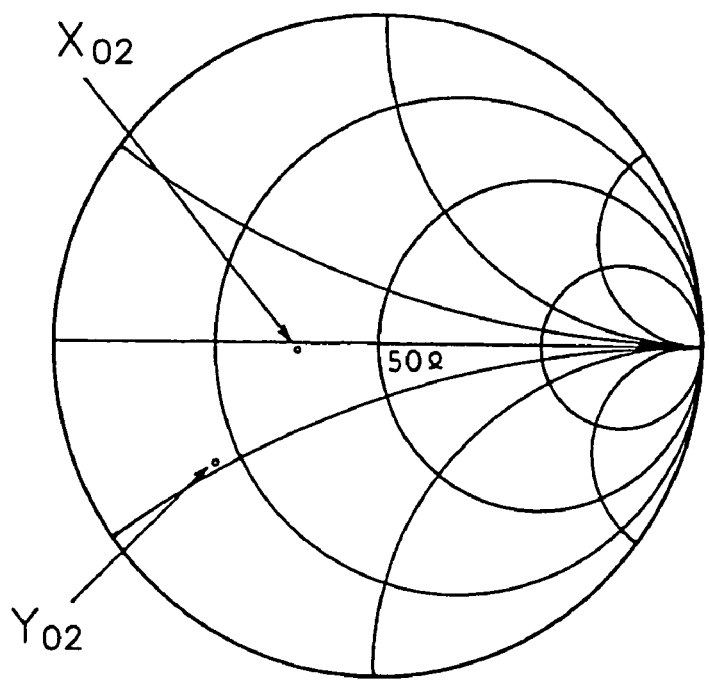

Such impedance matching circuit is optimized, usually assuming a case of input of a feeble signal, when the gain is not varied, in other words, when the gain of the amplifier is at maximum, and a favorable characteristic is obtained in the voltage standing wave ratio (VSWR) at the input end and output end of the amplifier. For example, FIG. 6(A) shows an example of measurement of VSWR at the input end when the gain is not varied and when the gain is varied in the amplifier of the configuration shown in the above publication, and FIG. 6(B) shows an example of measurement of VSWR at the output end when the gain is not varied and when the gain is varied in the amplifier of the configuration shown in the above publication, in which it is known that the measurement of VSWR is favorable when the gain is not varied in both cases. In FIG. 6(A), $X_{01}$ shows a point where the measurement of VSWR at the input end when the gain is not varied is 1.78, and $Y_{01}$ shows a point where the measurement of VSWR at the input end when the gain is varied is 9.89. In FIG. 6(B), $X_{02}$ shows a point where the measurement of VSWR at the output end when the gain is not varied is 1.69, and $Y_{02}$ shows a point where the measurement of VSWR at the output end when the gain is varied is 4.23.

On the other hand, when the gain is varied, that is, in the case the gain of the amplifier is minimum, in the amplifier of the configuration shown in the above publication, the semiconductor for signal attenuation is turned ON (in conducting state), and the input and output impedances of the amplifier are significantly different from those when the gain is not varied, and therefore if the impedance matching circuit is provided at each of the input and output ends, since these impedance matching circuits are optimized when the gain of the amplifier is maximum, and therefore VSWR when the gain is varied is extremely degraded as shown in FIG. 6(A) and FIG. 6(B).

As a result, it leads to degrading of characteristic of the filter connected in the front stage or rear stage of the amplifier, thereby extremely degrading the reception performance of the wireless communication appliance.

In the case of the amplifier designed to vary the gain by presence or absence of power supply without installing a circuit for varying the gain, although it is an advantage that the power consumption of the wireless communication appliance can be saved by cutting off the power supply, even in this case, since the input and output impedances of the amplifier are significantly different between when the power is supplied and when the power supply is cut off, VSWR at the input and output ends of the amplifier, when the power supply is cut off, is worse as compared when the power is supplied, and this is the same problem as in the amplifier having a circuit for varying the gain.

Further, in the amplifier for varying the gain by presence or absence of supply of supply voltage, since the gain when varying the gain (when the power supply is not cut off) is determined nearly by the isolation between input and output of the semiconductor element for signal amplification, it is impossible to arbitrarily set the gain attenuation amount, that is, the difference in gain when the gain is not varied (the power is supplied) and when the gain is varied (the power is not supplied), which is not convenient for use.

SUMMARY OF THE INVENTION

The invention is devised in the light of the above background; it is hence an object thereof to provide a variable gain amplifier having a favorable Voltage Standing Wave Ratio (VSWR) at the input and output end, regardless of presence or absence of gain variation while achieving low power consumption in gain variation.

It is another object of the invention to provide a variable gain amplifier havng a favorable VSWR at the input and output ends, regardless of the presence or absence of gain variation, and permitting arbitrary setting of the gain attenuation amount.

It is a different object of the invention to provide a variable gain amplifier having favorable input and output power characteristics in gain variation.

To achieve these objects, the variable gain amplifier of the invention is a variable gain amplifier designed to amplify the radio frequency signal by using a field effect transistor for signal amplification comprising input impedance correcting means for correcting the input impedance when varying the gain at the input side of the field effect transistor for signal amplification, output impedance correcting means for correcting the output impedance when varying the gain at the output side of the field effect transistor for signal amplification, and amplifier bypass means for passing the radio frequency input signal directly to the output side, skipping the field effect transistor for signal amplification, when varying the gain.

In this configuration, when varying the gain, that is, to obtain the minimum gain, the radio frequency input signal is fed to the output side by the amplifier bypass means, and fluctuations of the input impedance at the input side of the field effect transistor for signal amplification are corrected by the input impedance correcting means, and fluctuations of the output impedance at the output side of the field effect transistor for signal amplification are corrected by the output impedance correcting means, and therefore, as compared with the case not varying the gain, that is, the case of obtaining the maximum gain by operation of the field effect transistor for signal amplification only, fluctuations of VSWR at the input and output terminal of the amplifier when varying the gain are smaller, and the gain attenuation amount can be set arbitrarily. Moreover, the power consumption can be lowered when varying the gain.

Further, the variable gain amplifier of the invention is a variable gain amplifier designed to amplify the radio frequency signal by using a field effect transistor (FET) for signal amplification, in which the field effect transistor for signal amplification is of dual gate type, and a first gate terminal is connected to a radio frequency signal input terminal by way of a DC cut capacitor at an input side of the FET for amplification and an input impedance matching circuit, a drain terminal is connected to a radio frequency signal output terminal by way of an output impedance matching circuit and a DC cut capacitor at an output side of the FET for amplification, a source terminal of a field effect transistor for bypass of amplifier is connected at the junction of the input side capacitor and the input impedance matching circuit by way of a DC cut capacitor at a source side of the FET for bypass, a drain terminal of the field effect transistor for bypassing the amplifier is connected at the junction of the drain terminal of the field effect transistor for signal amplification and the output impedance matching circuit by way of a DC cut capacitor at drain side of the FET for bypassing, the drain terminal of field effect transistor for input impedance correction is connected at the junction of the input impedance matching circuit and a DC cut capacitor at input side of the FET for amplification by way of a first FET side DC cut capacitor for correction and a first FET side resistor for correction, a source terminal of the field effect transistor for input impedance correction is connected to ground by way of a first FET side bypass capacitor for correction, a drain terminal of a field effect transistor for output impedance correction is connected at the junction of the drain terminal of the field effect transistor for signal amplification and the output impedance matching circuit by way of a second FET side DC cut capacitor for correction and a second FET side resistor for correction, a source terminal of the field effect transistor for output impedance correction is connected to ground by way of a second FET side bypass capacitor for correction, each gate terminal of the field effect transistor for amplifier bypassing, the field effect transistor for input impedance correction, and the field effect transistor for output impedance correction is connected to the ground via a respective resistor, and each drain terminal and source terminal of the field effect transistor for amplifier bypassing, the field effect transistor for input impedance correction, and the field effect transistor for output impedance correction are connected to a first control voltage application terminal via a respective resistor, a source terminal of the field effect transistor for signal amplification is connected to a second gate terminal and a drain terminal of field effect transistor for bias SW by way of an inductor, this source terminal is connected to the ground by way of a capacitor, a source terminal of the field effect transistor for bias SW is connected to ground via a self-bias resistor, a gate terminal is connected to a second control voltage application terminal via a gate bias resistor.

Moreover, the variable gain amplifier of the invention is a variable gain amplifier designed to amplify the radio frequency signal by using a field effect transistor for signal amplification, in which amplifier bypass means mainly composed of a field effect transistor for amplifier bypassing is connected parallel to the field effect transistor for signal amplification, and a field effect transistor for bias SW for controlling the operation of this transistor is connected to the source terminal side of the field effect transistor for signal amplification, and a second gate terminal of the field effect transistor for signal amplification is connected at the junction of the source terminal of the field effect transistor for bias SW and of a self-bias resistor.

In such a configuration, when varying the gain, that is, to set the amplifier at minimum gain, if the level of the radio frequency input signal is increased to raise the voltage of the source terminal of the field effect transistor for signal amplification, the potential of the second gate terminal of the field effect transistor for signal amplification can be maintained almost at 0 V, and the voltage of this second gate terminal (G2) is always lower than the potential of the source terminal, so that a nonconducting state is always maintained between the drain and source of the field effect transistor for signal amplification, and as a result, after the input radio frequency signal of strong electric field passes through the amplifier bypass means, it does not leak to ground through the drain and source of the field effect transistor for signal amplification, so that a favorable linearity characteristic may be obtained.

Further, the variable gain amplifier of the invention is a variable gain amplifier designed to amplify the radio frequency signal by using a field effect transistor for signal amplification, in which the field effect transistor for signal amplification is of dual gate type, and a first gate terminal is connected to a radio frequency signal input terminal by way of a first DC cut capacitor and an input impedance matching circuit, a drain terminal is connected to a radio frequency signal output terminal by way of an output impedance matching circuit and a second DC cut capacitor, a source terminal of a field effect transistor for bypass of amplifier is connected at the junction of the first DC cut capacitor and the input impedance matching circuit by way of a third DC cut capacitor, a drain terminal of the field effect transistor for bypass of amplifier is connected at the junction of the drain terminal of the field effect transistor for signal amplification and the output impedance matching circuit by way of a fourth DC cut capacitor, each gate terminal of the field effect transistor for signal amplification and field effect transistor for bypass of amplifier is connected to the ground by way of each resistor, a source terminal of the field effect transistor for signal amplification is connected to the drain terminal of a field effect transistor for bias SW by way of an inductor, its drain terminal is connected to the ground by way of a capacitor, a second gate terminal of the field effect transistor for signal amplification and the source terminal of the field effect transistor for bias SW are mutually connected, a self-bias resistor and a bypass capacitor are connected between the junction and the ground, a gate terminal of the field effect transistor for bias SW is connected to a second control voltage application terminal by way of a gate bias resistor, and the drain terminal and source terminal of the field effect transistor for bypass of amplifier are connected to a first control voltage application terminal by way of each resistor.

BRIEF DESCRIPTION OF THE DRAWINGS

Figure 4:
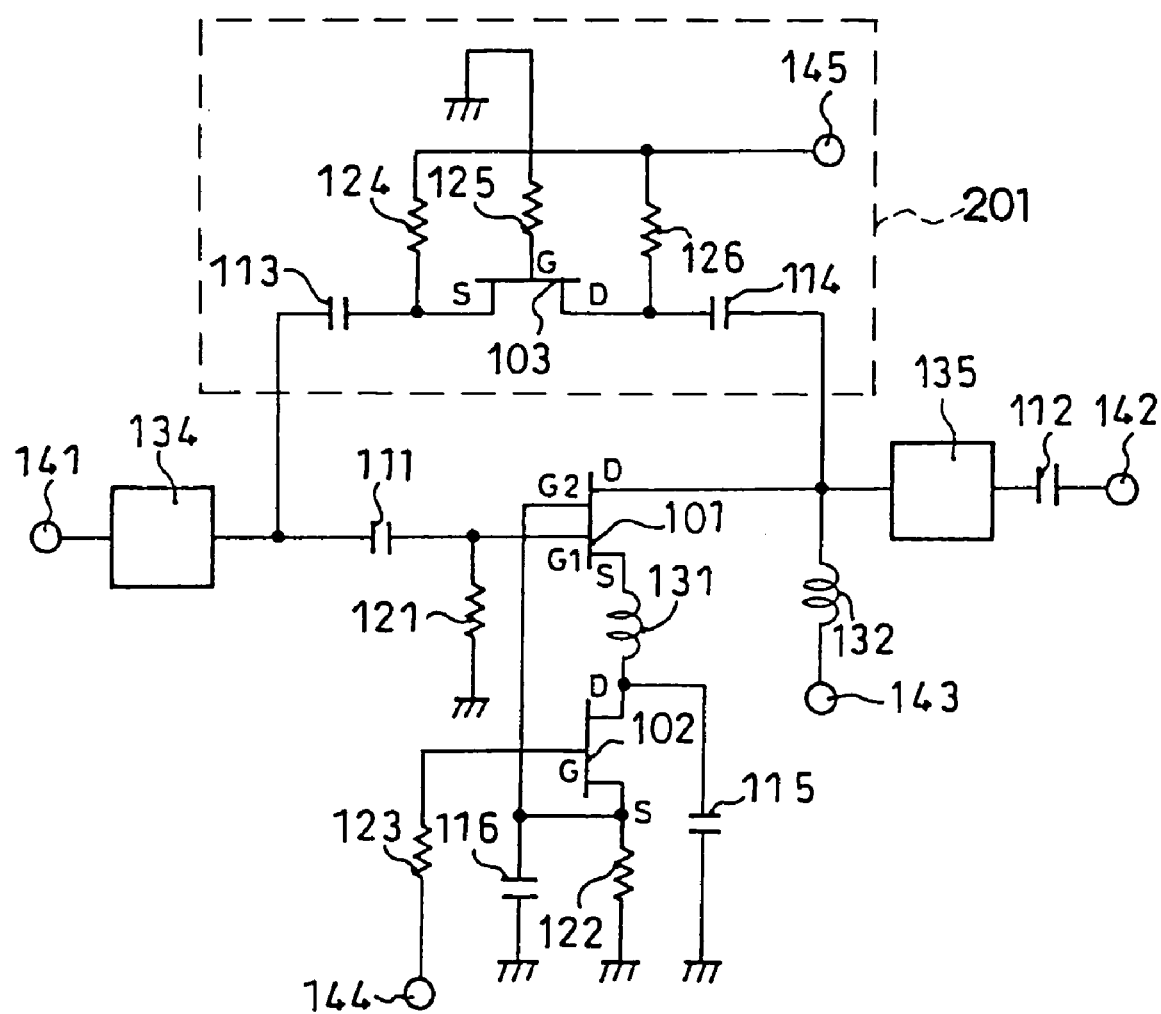
FIG. 4 is a circuit diagram showing an example of circuit configuration of a variable gain amplifier in other embodiment of the invention.

FIG. 1 is a circuit diagram showing an example of circuit configuration of a variable gain amplifier in an embodiment of the invention;

FIGS. 2(A) and 2(B) are characteristic graphs of Smith charts showing a test example of impedance and VSWR at input and output terminals of the variable gain amplifier shown in FIG. 1, in which FIG. 2(A) is a characteristic graph of impedance and VSWR at the radio frequency input terminal, and FIG. 2(B) is a characteristic graph of impedance and VSWR at the radio frequency output terminal;

FIG. 3 is a characteristic graph of gain changes due to input power by gain variation in the variable gain amplifier shown in FIG. 1;

FIG. 4 is a circuit diagram showing an example of circuit configuration of a variable gain amplifier in another embodiment of the invention;

FIG. 5 is a characteristic graph of gain changes due to input power by gain variation in the variable gain amplifier shown in FIG. 4; and FIGS. 6(A) and 6(B) are characteristic graphs of Smith charts showing an example of impedance and VSWR at input and output terminals in a conventional circuit, in which FIG. 6(A) is a characteristic graph of impedance and VSWR at the radio frequency input terminal, and FIG. 6(B) is a characteristic graph of impedance and VSWR at the radio frequency output terminal.

DETAILED DESCRIPTION

An embodiment of the invention is described while referring to FIG. 1 and FIGS. 2(A) to 2(B).

The members and configuration described below are not intended to limit the invention, but may be changed or modified within the scope and true spirit of the invention.

A variable gain amplifier in the embodiment of the invention is designed to amplify an input radio frequency signal by means of a signal amplifying FET (field effect transistor) 1, and can select the presence or absence of gain variation by means of a bias SW FET 5. Further, at the first gate terminal (G1) side of the signal amplifying FET 1, a first DC cut capacitor (first FET side DC cut capacitor for correction) 6, a resistor (first FET side resistor for correction) 7, and an input impedance correction FET 2 are disposed, at the drain terminal side of the signal amplifying FET 1, a second DC cut capacitor (second FET side DC cut capacitor for correction) 12, a resistor (second FET side resistor for correction) 13, and an output impedance correction FET 3 are disposed, and further between the first gate terminal (G1) and drain terminal of the signal amplifying FET 1, a fourth DC cut capacitor (bypass FET source side DC cut capacitor) 23, an amplifier bypass FET 4, and a fifth DC cut capacitor (bypass FET drain side DC cut capacitor) 27 are disposed.

Explaining the circuit connection specifically, first, the signal amplifying FET 1 is preferably MESFET (metal semiconductor field effect transistor), and in the embodiment of the invention it has so-called dual gates of n-channel depression type.

The first gate terminal (G1) of this signal amplifying FET 1 is connected to the ground by way of a resistor 19, and is also connected to a radio frequency signal input terminal 32 by way of a third DC cut capacitor 18 and an input impedance matching circuit 29.

A source terminal of the signal amplifying FET 1 is connected to a drain terminal of the bias SW FET 5, a second gate terminal (G2) of the signal amplifying FET, and one end of a source capacitor 22 by way of a source inductor 20, and other end of the source capacitor 22 is connected to the ground. A source terminal for bias SW FET 5 is connected to the ground by way of a self-bias resistor 21. A gate terminal of the bias SW FET 5 is connected to a second control voltage application terminal 37 by way of a gate bias resistor 35.

A drain terminal of the signal amplifying FET 1 is connected to a supply voltage application terminal 34 by way of a choke inductor 28, and is further connected to a radio frequency signal output terminal 33 by way of an output impedance matching circuit 30 and a sixth DC cut capacitor (amplifying FET output side DC cut capacitor) 31.

On the other hand, the input impedance correcting FET 2 is, for example, of n-channel depression type, and its drain terminal is connected at the junction of the third DC cut capacitor 18 and input impedance matching circuit 29 by way of a resistor 7 (first correcting FET side resistor) and first DC cut capacitor 6 (first correcting FET side DC cut capacitor). A source terminal of the input impedance correcting FET 2 is connected to the ground by way of a first bypass capacitor (first correcting FET side bypass capacitor) 11, and its gate terminal is connected to the ground by way of a resistor 10. Further, a drain terminal and a source of the input impedance correcting FET 2 are commonly connected to a first control voltage application terminal 36 by way of a first bias resistor 8 and a second bias resistor 9, respectively.

In the embodiment of the invention, the input impedance correcting means is realized by the portion mainly composed of this input impedance correcting FET 2.

The output impedance correcting FET 3 is similar to the input impedance correcting FET 2, and is, for example, n-channel depression type, and its drain terminal is connected to the drain terminal of the signal amplifying FET 1 by way of a resistor 13 and a second DC cut capacitor 12, while its source terminal is connected to the ground by way of a second bypass capacitor (second correcting FET side bypass capacitor) 17. A gate terminal of the output impedance correcting FET 3 is connected to the ground by way of a resistor 16. A drain terminal and a source terminal of the output impedance correcting FET 3 are commonly connected to the first control voltage application terminal 36 by way of a third bias resistor 14 and a fourth bias resistor 15, respectively.

In the embodiment of the invention, the output impedance correcting means is realized by the portion mainly composed of this output impedance correcting FET 3.

The amplifier bypass FET 4 is similar to the input impedance correcting FET 2, and is, for example, —channel depression type, and its source terminal is connected at the junction of the third DC cut capacitor 18 and input impedance matching circuit 29 by way of a fourth DC cut capacitor 23, while its drain terminal is connected to the drain terminal of the signal amplifying FET 1 by way of a fifth DC cut capacitor 27. On the other hand, a gate terminal of the amplifier bypass FET 4 is connected to the ground by way of a resistor 25, while its source terminal and drain terminal are commonly connected to the first control voltage application terminal 36 by way of a fifth bias resistor 24 and a sixth bias resistor 26, respectively.

In the embodiment of the invention, the amplifier bypass means is realized by the portion mainly composed of this amplifier bypass FET 4.

The operation of this structure is explained.

Suppose the control voltage applied to the first control voltage application terminal 36 to be VCONT36, and the pinch-off voltage of input impedance correcting FET 2, output impedance correcting FET 3, and amplifier bypass FET 4 to be identical and Vp.

First, when the gain is not varied (to obtain the maximum gain), a supply voltage so as to actuate the signal amplifying FET 1 is applied to the supply voltage application terminal 34, a bias voltage so as to turn on the bias SW FET 5 (to set in conducting state) is applied to the second control voltage application terminal 36, and a voltage to satisfy the relation of VCONT36≧−Vp is applied to the first control voltage application terminal 36.

As a result, the signal amplifying FET 1 is set in operating state, and the input impedance correcting FET 2, output impedance correcting FET 3, and amplifier bypass FET 4 are all turned OFF (set in nonconducting state).

Each gate width Wgt of the input impedance correcting FET 2, output impedance correcting FET 3, and amplifier bypass FET 4, each capacity value of the DC cut capacitors 6, 12, 23, 27, each resistance value of the resistors 7 and 13, and each capacity value of the bypass capacitors 11 and 17 are optimized so as to suppress the attenuation of the radio frequency input signal and radio frequency output signal in these elements in the state not varying the gain, and therefore the radio frequency signal entered from the radio frequency signal input terminal 32 through the input impedance matching circuit 29 is fed into the gate terminal (G1) of the signal amplifying FET 1 by way of the third DC cut capacitor 18 without being attenuated by the input impedance correcting FET 2 and amplifier bypass FET 4, while the radio frequency signal being amplified and delivered from the drain terminal is issued to the radio frequency signal output terminal 33 by way of the output impedance matching circuit 30 and DC cut capacitor 31 without being attenuated by the output impedance correcting FET 3, so that the maximum gain is obtained by operating same as an ordinary amplifier.

On the other hand, when varying the gain (to obtain the minimum gain), a bias voltage so as to turn OFF the bias SW FET 5 is applied to the second control voltage application terminal 37, and a voltage to satisfy the relation of VCONT36≦−Vp is applied to the first control voltage application terminal 36.

As a result, the signal amplifying FET 1 is turned OFF, and the input impedance correcting FET 2, output impedance correcting FET 3, and amplifier bypass FET 4 are all turned ON (set in conducting state). In this case, since the signal amplifying FET 1 is turned OFF, the radio frequency input signal does not pass through the signal amplifying FET 1, but passes through the bypass route composed of the fourth DC cut capacitor 23, amplifier bypass FET 4, and fifth DC cut capacitor 27.

Hence, since the gain when varying the gain is determined by the passing loss in the bypass route composed of the fourth DC cut capacitor 23, amplifier bypass FET 4, and fifth DC cut capacitor 27, by optimizing the gate width Wgt of the amplifier bypass FET and the capacity value of the fourth and fifth DC cut capacitors 23, 27, the gain in gain variation and the gain attenuation amount can be easily set to desired values.

If the supply voltage so as to actuate the signal amplifying FET 1 remains applied to the supply voltage application terminal 34, since the bias SW FET 5 is turned OFF, the signal amplifying FET 1 does not operate, and the signal amplifying FET 1 is securely kept in OFF state. Accordingly, when varying the gain, the power consumption in the amplifier can be lowered, and the battery operation time of the wireless communication appliance using the amplifier can be extended.

Thus, in the amplifier of the embodiment of the invention, while keeping the signal amplifying FET 1 in off state, by setting the application voltage of the first control voltage application terminal 36 at the value specified above, the input impedance correcting FET 2, amplifier bypass FET 4 and output impedance correcting FET 3 can be turned ON, so that the gate impedance and drain impedance of the signal amplifying FET 1 can be set to the same value as in the on state.

As a result, the VSWR of the radio frequency signal input terminal 32 and radio frequency signal output terminal 33 in the state of addition of the input impedance matching circuit 29 and output impedance matching circuit 30 can be maintained at a favorable value whether the signal amplifying FET 1 is ON or OFF.

Herein, the gate width Wgt of the input impedance correcting FET 2, the resistance value of the resistor 7, and the capacity value of the first DC cut capacitor 6 and first bypass capacitor 11 are set at optimum values so that the VSWR of the radio frequency signal input terminal 32 in gain variation (to obtain the minimum gain) may not be worse as compared with the case of not varying the gain (to obtain the maximum gain). Similarly, the gate width Wgt of the output impedance correcting FET 3, the resistance value of the resistor 13, and the capacity value of the second DC cut capacitor 12 and bypass capacitor 17 are set at optimum values so that the VSWR of the radio frequency signal output terminal 33 in gain variation may not be worse as compared with the case of not varying the gain.

FIG. 2(A) and FIG. 2(B) show test examples of VSWR in the radio frequency signal input terminal 32 and radio frequency signal output terminal 33 of the amplifier in the embodiment of the invention.

FIG. 2(A) shows the test example of VSWR in the radio frequency signal input terminal 32 and FIG. 2(B) shows the test example of VSWR in the radio frequency signal output terminal 33, both showing test examples of VSWR when varying the gain and when not varying the gain. In FIG. 2(A), $X_{11}$ shows a point where the measurement of VSWR at the radio frequency signal input terminal 32 when the gain is not varied is 1.60, and $Y_{11}$ shows a point where the measurement of VSWR at the radio frequency signal input terminal 32 when the gain is varied is 1.08. In FIG. 2(B), $X_{12}$ shows a point where the measurement of VSWR at the radio frequency signal output terminal 33 when the gain is not varied is 1.78, and $Y_{12}$ shows a point where the measurement of VSWR at the radio frequency signal output terminal 33 when the gain is varied is 1.27.

In any case, although there is a slight difference in the VSWR between when the gain is varied and when the gain is not varied, it is significantly improved as compared with the prior art (see FIG. 6).

In this structural example, the amplifier bypass FET 4, input impedance correcting FET 2 and output impedance correcting FET 3 are provided by one piece each, but as required a plurality of them may be connected in series.

In this embodiment, while realizing a low power consumption in gain variation, a variable gain amplifier of favorable VSWR at input and output end regardless of presence or absence of gain variation can be obtained. In the circuit configuration of such variable gain amplifier, when not varying the gain (to obtain the maximum gain), a voltage so as to actuate the signal amplifying FET 1 is applied to the supply voltage application terminal 34, a bias voltage so as to turn ON the bias SW FET 5 is applied to the second control voltage application terminal 37, and a bias voltage of −Vp or more is applied to the first control voltage application terminal 36, supposing the pinch-off voltage of the amplifier bypass FET 4, input impedance correcting FET 2, and output impedance correcting FET 3 to be Vp, and therefore the signal amplifying FET 1 is set in a state of amplifying operation, while the amplifier bypass FET 4, input impedance correcting FET 2, and output impedance correcting FET 3 are turned OFF. Accordingly, the radio frequency signal applied to the radio frequency signal input terminal 32 is not attenuated by the amplifier bypass FET 4, input impedance correcting FET 2, and output impedance correcting FET 3, and is amplified by the signal amplifying FET 1 at maximum gain, and is obtained from the radio frequency signal output terminal 33.

On the other hand, when varying the gain, that is, to obtain the minimum gain, a bias voltage so as to turn OFF the bias SW FET 5 is applied to the second control voltage application terminal 37, a bias voltage of −Vp or less is applied to the first control voltage application terminal 36, and therefore the signal amplifying FET 1 is turned OFF, while the amplifier bypass FET 4, input impedance correcting FET 2, and output impedance correcting FET 3 are turned ON. Accordingly, the radio frequency signal applied to the radio frequency signal input terminal 32 is skipped to the radio frequency signal output terminal 33 by way of the amplifier bypass FET 4, and input impedance fluctuations at the input side of the signal amplifying FET 1 are corrected by the circuit portion mainly composed of the input impedance correcting FET 2, while output impedance fluctuations at the output side of the signal amplifying FET 1 are corrected by the circuit portion mainly composed of the output impedance correcting FET 3. Therefore, as compared with the state not varying the gain, that is, the state of obtaining the maximum gain by operation of the signal amplifying FET 1 only, fluctuations of the VSWR at the input and output terminal in gain variation are smaller, and the power consumption can be lowered when varying the gain.

In this variable gain amplifier, however, the following problems are involved.

First, if the signal amplifying FET 1 is turned OFF and the radio frequency signal applied to the radio frequency signal input terminal 32 is skipped to the radio frequency signal output terminal 33 by way of the amplifier bypass FET 4, since the signal amplifying FET 1 is disposed parallel to the bypass circuit mainly composed of the amplifier bypass FET 4, the radio frequency signal applied to the radio frequency signal input terminal 32 is actually applied to the first gate terminal (G1) of the signal amplifying FET 1, and its signal level increases along with the increase of the level of the radio frequency signal applied to the radio frequency signal input terminal 32.

Herein, between the first gate terminal (G1) of the signal amplifying FET 1 and the source, it may be regarded that a diode is connected equivalently. Therefore, as mentioned above, when the potential of the first gate terminal (G1) is raised by the radio frequency signal input, the source potential is also elevated similarly. Besides, since the second gate terminal (G2) of the signal amplifying FET 1 is connected to the source of the signal amplifying FET 1 by way of the source inductor 20, the potential of the second gate terminal (G2) consequently elevated together with the source potential.

Incidentally, in the drain of the signal amplifying FET 1, a bias for operating this signal amplifying FET 1 is preliminarily applied from the supply voltage application terminal 34 by way of the choke inductor 28, and when a radio frequency signal input signal of strong electric field is applied, for example, to the radio frequency signal input terminal 32, the potentials of the source terminal and second gate terminal (G2) of the signal amplifying FET 1 are raised as mentioned above, and hence the potentials of the drain terminal, source terminal and second gate terminal (G2) of the signal amplifying FET 1 are nearly at a same potential (0 V), which may bring about an inconvenience of making a conducting state between the drain and the source of the signal amplifying FET 1 which are supposed to be in nonconducting state. Accordingly, the radio frequency signal of strong electric field applied to the radio frequency signal input terminal 32 is delivered to the radio frequency signal output terminal 33 by way of the input impedance matching circuit 29, DC cut capacitor 23, amplifier bypass FET 4, and DC cut capacitor 27, and may further leak to the ground through the drain and source of the signal amplifying FET 1 substantially set in conducting state, and the source inductor 20 and source capacitor 22. In this way, the radio frequency signal to be issued to the radio frequency signal output signal 33 is attenuated, and in the variable gain amplifier shown in FIG. 1, the linearity characteristic in the case of input of radio frequency signal of strong electric field is extremely spoiled.

FIG. 3 is a characteristic diagram showing the mode of gain change due to input power by gain variation in the variable gain amplifier shown in FIG. 1, in which when the input level of the radio frequency signal is increased, the linearity characteristic as the amplifier is extremely impaired.

Other embodiment of the invention is described below while referring to FIG. 4 and FIG. 5.

The members and configuration described below are not intended to limit the invention, but may be changed or modified within the scope and true spirit of the invention.

A variable gain amplifier in the other embodiment of the invention is designed to amplify an input radio frequency signal by means of a signal amplifying FET (field effect transistor) 101, and can select presence or absence of gain variation by means of a bias SW FET 102. Further, between the first gate terminal (G1) and drain terminal of the signal amplifying FET 101, bypass circuit 201 is provided as amplifier bypass means which is composed of a third DC cut capacitor (bypass FET source side DC cut capacitor) 113, an amplifier bypass FET 103, and fourth DC cut capacitor (bypass FET drain side DC cut capacitor) 114.

Explaining the circuit connection specifically, first, the signal amplifying FET 101 is preferably MESFET (metal semiconductor field effect transistor), and in the embodiment of the invention it has so-called dual gates of —channel depression type.

The first gate terminal (G1) of this signal amplifying FET 101 is connected to the ground by way of a resistor 121, and is also connected to a radio frequency signal input terminal 141 by way of a first DC cut capacitor 111 and an input impedance matching circuit 134.

A source terminal of the signal amplifying FET 101 is connected to a drain terminal of the bias SW FET 102, and one end of a source capacitor 115 by way of a source inductor 131, and other end of the source capacitor 115 is connected to the ground. A source terminal for bias SW FET 102 is mutually connected with a second gate terminal (G2) of the signal amplifying FET 101, and between this mutual connection junction and the ground, a second resistor (self-bias resistor) 122 and a bypass capacitor 116 are connected in parallel.

A drain terminal of the signal amplifying FET 101 is connected to a supply voltage application terminal 143 by way of a choke inductor 132, and is further connected to a radio frequency signal output terminal 142 by way of an output impedance matching circuit 135 and a second DC cut capacitor 116.

On the other hand, the amplifier bypass FET 103 is, for example, of —channel depression type, and its source terminal is connected at the junction of the first DC cut capacitor 111 and input impedance matching circuit 134 by way of a third DC cut capacitor 113, while its drain terminal is connected to the drain terminal of the signal amplifying FET 101 by way of a fourth DC cut capacitor 114. On the other hand, a gate terminal of the amplifier bypass FET 103 is connected to the ground by way of a fifth resistor 125, while its source terminal and drain terminal are commonly connected to the first control voltage application terminal 145 by way of a fourth resistor 124 and a sixth resistor 126, respectively.

The operation of this structure is explained.

Suppose the control voltage applied to the first control voltage application terminal 145 to be VCONT145, and the pinch-off voltage of the amplifier bypass FET 103 to be Vp.

First, when the gain is not varied (to obtain the maximum gain), a supply voltage so as to actuate the signal amplifying FET 101 is applied to the supply voltage application terminal 143, a bias voltage so as to turn on the bias SW FET 105 (to set in conducting state) is applied to the second control voltage application terminal 144, and a voltage to satisfy the relation of VCONT145≧−Vp is applied to the first control voltage application terminal 145.

As a result, the signal amplifying FET 101 is set in operating state, and the amplifier bypass FET 103 all turned OFF (set in nonconducting state).

In this state without gain variance, the gate width Wgt of the amplifier bypass FET 103, and each capacity value of the third and fourth DC cut capacitors 113, 114 are optimized so as to suppress the attenuation of the radio frequency input signal and radio frequency output signal in these elements, and therefore the radio frequency signal entered from the radio frequency signal input terminal 141 through the input impedance matching circuit 134 is fed into the gate terminal (G1) of the signal amplifying FET 101 by way of the first DC cut capacitor 111 without being attenuated by the amplifier bypass FET 103, and the radio frequency signal being amplified and delivered from the drain terminal is issued of the radio frequency signal output terminal 142 by way of the output impedance matching circuit 135 and second DC cut capacitor 112 without being attenuated by the amplifier bypass FET 103, so that the maximum gain is obtained by operating same as an ordinary amplifier.

On the other hand, when varying the gain (to obtain the minimum gain), a bias voltage so as to turn OFF the bias SW FET 102 is applied to the second control voltage application terminal 144, and a voltage to satisfy the relation of VCONT145≦−Vp is applied to the first control voltage application terminal 145.

As a result, the signal amplifying FET 101 is turned OFF, and the amplifier bypass FET 103 is turned ON (set in conducting state). In this case, since the signal amplifying FET 101 is turned OFF, the radio frequency input signal does not pass through the signal amplifying FET 101, but passes through the bypass route composed of the third DC cut capacitor 113, amplifier bypass FET 103, and fourth DC cut capacitor 114.

Hence, since the gain when varying the gain is determined by the passing loss in the bypass circuit 201 composed of the third DC cut capacitor 113, amplifier bypass FET 103, and fourth DC cut capacitor 114, by optimizing the gate width Wgt of the amplifier bypass FET 103 and the capacity values of the third and fourth DC cut capacitors 113, 114, the gain in gain variation and the gain attenuation amount can be easily set to desired values.

For example, in the circuit shown in FIG. 1, as mentioned above, when the level of the radio frequency input signal increases when varying the gain, the potentials of the source terminal and second gate terminal (G2) of the signal amplifying FET 1 elevate, and the potentials of the drain terminal, source terminal and second gate terminal (G2) of the signal amplifying FET 1 are nearly the same potential (0 V), and the drain and source of the signal amplifying FET 1 which are supposed to be in nonconducting state are set in conducting sate, and the radio frequency signal passing through the bypass circuit mainly composed of the amplifier bypass FET 4 leaks to the ground through the drain and source of the signal amplifying FET 1. By the leak of the radio frequency signal, the radio frequency signal to be issued to the radio frequency output terminal 33 is attenuated, and hence if a radio frequency signal of high electric field is entered during gain variation, the linearity characteristic of the amplifier is lost.

By contrast, in the variable gain amplifier of the other embodiment of the invention, as mentioned above, since the second gate terminal (G2) of the signal amplifying FET 101 is connected at the junction of the source terminal and second resistor (self-bias resistor) 122 of the bias SW FET 102, if the level of the radio frequency input signal increases when varying the gain and the voltage of the source terminal of the signal amplifying FET 101 elevates, the potential of the second gate terminal (G2) of the signal amplifying FET 101 remains almost at 0 V, and the voltage of the second gate terminal (G2) is always kept lower than the potential of the source terminal. That is, in the gain variation time, since the second gate terminal (G2) of the signal amplifying FET 101 can be always set in pinch-off state, even in the case of input of radio frequency signal of strong electric field from the radio frequency signal input terminal 141, the drain and source of the signal amplifying FET 101 can be always kept in nonconducting state. As a result, the radio frequency signal of strong electric field entering from the radio frequency signal input terminal 141 passes through the bypass circuit 201, and is issued to the radio frequency signal output terminal 142, without leaking to the ground through the drain and source of the signal amplifying FET 101, that is, without being attenuated by the signal amplifying FET 101, and therefore the variable gain amplifier of this embodiment of the invention is capable of obtaining a favorable linearity characteristic even in the case of input of radio frequency signal of strong electric field.

FIG. 5 is a characteristic diagram showing gain changes due to input power by gain variation of the variable gain amplifier in the other embodiment of the invention, and when compared with the characteristic diagram (FIG. 3) of a similar circuit shown in FIG. 1, in the case of the circuit in FIG. 1, the input power when the gain is compressed by 1 dB (that is, the input power at 1 dB gain compression) is about −2.9 dBm, whereas the variable gain amplifier in the other embodiment of the invention shows the input power at 1 dB gain compression of about +14.1 dBm, and as compared with the circuit in FIG. 1, the input power at 1 dB gain compression is improved by about 17 dB.

In the shown structural example, the amplifier bypass FET 103 is composed of one stage, but it may be composed by connecting a plurality of stages in series as required.

As described herein, according to the invention, when varying, that is, to obtain the minimum gain only, by configuring to operate the field effect transistor for input impedance correction composing the input impedance correcting means, the field effect transistor for output impedance correction composing the output impedance correcting means, and the field effect transistor for amplifier bypass composing the amplifier bypass means, the field effect transistor for signal amplification is kept in non-operating state, and as compared with the state not varying the gain, that is, the state of obtaining the maximum gain by operation of the field effect transistor for signal amplification, fluctuations of VSWR at the radio frequency input terminal and radio frequency output terminal in gain variation time can be decreased, and therefore the characteristics of the filter and others connected in the front stage or rear stage of the variable gain amplifier are not spoiled even when varying the gain.

Also according to the invention, since the gain and gain attenuation quantities in gain variation can be set freely, and an amplifier of desired gain and gain attenuation quantities can be easily obtained. At the same time, the power consumption can be lowered when varying the gain.

Moreover, according to the invention, when varying the gain, that is, to obtain the minimum gain, in the event of input of radio frequency signal of strong electric field, the transistor for amplifying the signal which is supposed to be in non-operating state is prevented from coming to operating state by radio frequency signal of strong electric field, and therefore favorable input and output power characteristics are obtained, and when applied in a wireless communication appliance, the gain can be varied according to the input signal level without degrading the reception performance.

Though several embodiments of the present invention are described above, it is to be understood that the present invention is not limited only to the above-mentioned, various changes and modifications may be made in the invention without departing from the spirit and scope thereof.

What is claimed is:

1. Variable gain amplifier for amplifying a radio frequency signal by using a field effect transistor (FET) for signal amplification, in which the field effect transistor for signal amplification is of dual gate type, and
   a first gate terminal is connected to a radio frequency signal input terminal via a DC cut capacitor at an input side of said FET for amplification and via an input impedance matching circuit,
   a drain terminal is connected to a radio frequency signal output terminal via an output impedance matching circuit and a DC cut capacitor at an output side of said FET for amplification;
   wherein a source terminal, of a field effect transistor (FET) for bypassing an amplifier element, is connected at a junction of the input side capacitor and the input impedance matching circuit via a DC cut capacitor at a source side of said FET for amplifier bypassing, a drain terminal of the field effect transistor for amplifier bypassing is connected at a junction of the drain terminal of the field effect transistor for signal amplification and the output impedance matching circuit via a DC cut capacitor at drain side of said FET for bypassing;
   wherein the drain terminal of said field effect transistor for input impedance correction is connected at a junction of the input impedance matching circuit and a DC cut capacitor at an input side of said FET for amplification, via a first FET side DC cut capacitor for correction and a first FET side resistor for correction,
   wherein a source terminal of the field effect transistor for input impedance correction is connected to ground via a first FET side bypass capacitor for correction;
   wherein a drain terminal of a field effect transistor for output impedance correction is connected at a junction of the drain terminal of the field effect transistor for signal amplification and the output impedance matching circuit via a second FET side DC cut capacitor for correction and a second FET side resistor for correction,
   wherein a source terminal of the field effect transistor for output impedance correction is connected to ground via a second FET side bypass capacitor for correction;
   wherein each gate terminal of the field effect transistor for amplifier bypassing, the field effect transistor for input impedance correction, and the field effect transistor for output impedance correction is connected to ground via a respective resistor;
   wherein each drain terminal and source terminal of the field effect transistor for amplifier bypassing, the field effect transistor for input impedance correction, and the field effect transistor for output impedance correction are connected to a first control voltage application terminal via a respective resistor;
   wherein a source terminal of the field effect transistor for signal amplification is connected to a second gate terminal and a drain terminal of a field effect transistor for bias SW via an inductor, this source terminal is connected to ground via a capacitor; and
   wherein a source terminal of the field effect transistor for bias SW is connected to ground via a self-bias resistor, and a gate terminal thereof is connected to a second control voltage application terminal via a gate bias resistor.

2. Variable gain amplifier of claim 1, wherein a selected one of said field effect transistor for amplifier bypassing, said field effect transistor for input impedance correction, and the field effect transistor for output impedance correction comprises a plurality of transistors connected in series.

3. Variable gain amplifier for amplifying a radio frequency signal by using a field effect transistor for signal amplification, wherein an amplifier bypass means comprising a field effect transistor for amplifier element bypassing is connected parallel to the field effect transistor for signal amplification,
   wherein a field effect transistor for bias SW for controlling the operation of the transistor for signal amplification is connected to the source terminal side of the field effect transistor for signal amplification, and
   wherein a second gate terminal of the field effect transistor for signal amplification is connected at a junction of the source terminal of the field effect transistor for bias SW and a self-bias resistor.

4. Variable gain amplifier for amplifying a radio frequency signal by using a field effect transistor for signal amplification,
   wherein the field effect transistor for signal amplification is of dual gate type, a first gate terminal is connected to a radio frequency signal input terminal via a first DC cut capacitor and an input impedance matching circuit, and a drain terminal is connected to a radio frequency signal output terminal via an output impedance matching circuit and a second a DC cut capacitor;
   wherein a source terminal of a field effect transistor for amplifier element bypassing, is connected at a junction of the first DC cut capacitor and the input impedance matching circuit via a third DC cut capacitor, and a drain terminal, of the field effect transistor for amplifier element bypassing, is connected at a junction of the drain terminal of the field effect transistor for signal amplification and the output impedance matching circuit via a fourth DC cut capacitor;

wherein each gate terminal of the field effect transistor for signal amplification and field effect transistor for amplifier element bypassing is connected to ground via a respective resistor, a source terminal of the field effect transistor for signal amplification is connected to a drain terminal of a field effect transistor for bias SW via an inductor, and said drain terminal is connected to ground via a capacitor;

wherein a second gate terminal of the field effect transistor for signal amplification and the source terminal of the field effect transistor for bias SW are mutually connected, and a self-bias resistor and a bypass capacitor are connected between the junction and ground;

wherein a gate terminal of the field effect transistor for bias SW is connected to a second control voltage application terminal via a gate bias resistor; and wherein the drain terminal and the source terminal of the field effect transistor for amplifier element bypassing are connected to a first control voltage application terminal via a respective resistor.

* * * * *